United States Patent
Matsubara et al.

(10) Patent No.: US 9,813,028 B2
(45) Date of Patent: Nov. 7, 2017

(54) WIRELESS DEVICE

(71) Applicant: FUJITSU LIMITED, Kawasaki-shi, Kanagawa (JP)

(72) Inventors: Satoshi Matsubara, Kawasaki (JP); Hideharu Shako, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/251,871

(22) Filed: Aug. 30, 2016

(65) Prior Publication Data

US 2017/0093346 A1    Mar. 30, 2017

(30) Foreign Application Priority Data

Sep. 28, 2015    (JP) .................................. 2015-190414

(51) Int. Cl.
| | | |
|---|---|---|
| H03F 1/26 | (2006.01) | |
| H03F 1/32 | (2006.01) | |
| H03F 3/24 | (2006.01) | |
| H04W 88/02 | (2009.01) | |

(52) U.S. Cl.
CPC ............... H03F 1/32 (2013.01); H03F 3/245 (2013.01); H04W 88/02 (2013.01)

(58) Field of Classification Search
CPC . H03F 1/26; H03F 1/32; H03F 1/3241; H03F 1/3247
USPC ................................................. 330/136, 149
See application file for complete search history.

(56) References Cited

U.S. PATENT DOCUMENTS

| | | | | |
|---|---|---|---|---|
| 6,975,167 | B2* | 12/2005 | Saed | ...................... H03F 1/0294 |
| | | | | 330/107 |
| 2005/0073361 | A1 | 4/2005 | Hamada et al. | |
| 2009/0104882 | A1 | 4/2009 | Suzuki et al. | |
| 2011/0116558 | A1 | 5/2011 | Otaka et al. | |
| 2011/0227644 | A1 | 9/2011 | Matsubara et al. | |

FOREIGN PATENT DOCUMENTS

| | | |
|---|---|---|
| JP | 09-116474 | 5/1997 |
| JP | 2009-118454 A | 5/2009 |
| JP | 2010-193280 A | 9/2010 |
| JP | 2011-199428 A | 10/2011 |
| WO | 03/103166 A1 | 12/2003 |
| WO | 2007/049474 A1 | 5/2007 |

* cited by examiner

*Primary Examiner* — Steven J Mottola
(74) *Attorney, Agent, or Firm* — Fujitsu Patent Center

(57) ABSTRACT an amplifier amplifies electrical power of signals. A calculating unit calculates a cumulative value for each of first samples and second samples, between which a difference in electrical power or phase is within a first range, in a first sample group and a second sample group corresponding to a first signal that is a signal before amplification in the amplifier and a second signal that is a signal after amplification in the amplifier. Then, the calculating unit calculates, by using the calculated cumulative value, a phase difference between the first signal and the second signal. The correction unit corrects the phase difference by using a correction amount calculated from the phase difference. The updating unit updates, by using the first signal and the second signal of which the phase difference is corrected, a distortion compensation coefficient that is used to compensate nonlinear distortion generated in the amplifier.

4 Claims, 17 Drawing Sheets

WIRELESS DEVICE

CROSS-REFERENCE TO RELATED APPLICATION

This application is based upon and claims the benefit of priority of the prior Japanese Patent Application No. 2015-130414, filed on Sep. 28, 2015, the entire contents of which are incorporated herein by reference.

FIELD

The embodiments discussed herein are related to a wireless device.

BACKGROUND

For example, in wireless devices, such as base stations, user terminals, and the like in wireless communication systems, amplifiers (power amplifier; hereinafter, sometimes referred to as "PAs") that amplify electrical power of transmission signals are provided. In the wireless devices, in general, in order to enhance the power efficiency of the PAs, the pas are operated in the vicinity of the saturation region of the PAs. However, if a PA is operated in the vicinity of the saturation region, nonlinear distortion is increased. Thus, in order to reduce electrical power leaking into an adjacent channel by suppressing the nonlinear distortion generated in the PA, a distortion compensation unit that compensates nonlinear distortion generated in the PA is provided in the wireless device.

There is a "pre-distortion (hereinafter, sometimes referred to as a "PD") system" as one of the distortion compensation systems used in a distortion compensation unit. By previously multiplying a distortion compensation coefficient that has the inverse characteristic of the nonlinear distortion generated in the PA by a transmission baseband signal that has not been input to the PA, the distortion compensation unit that is used in the PD system increases the linearity of output signals of the PA and suppresses the distortion generated in an output signal of the PA. By multiplying the distortion compensation coefficient by the transmission baseband signal, the distortion of the transmission baseband signal is compensated. In a description below, the signal obtained by multiplying the distortion compensation coefficient by the transmission baseband signal is sometimes referred to as a "pre-distortion signal (PD signal)". Thus, before the PD signal is input to the PA, the FD signal becomes a previously distorted signal in accordance with the inverse characteristic of the nonlinear distortion in the PA.

For example, as a distortion compensation unit in a PD system, there is a unit that includes a look-up table (hereinafter, sometimes referred to as a "distortion compensation table") in which a plurality of distortion compensation coefficients is stored. The distortion compensation unit that includes the distortion compensation table reads, from the distortion compensation table, a distortion compensation coefficient that is in accordance with an amplitude value of a transmission baseband signal that is input to the distortion compensation unit and multiplies the read distortion compensation coefficient by the transmission baseband signal. The distortion compensation coefficients stored in the distortion compensation table are sequentially updated such that an error between both the signals obtained by comparing a transmission baseband signal that is used as the reference signal with a signal that is output from the PA and is fed back (hereinafter, sometimes referred to as a "feedback signal") is the minimum.

Patent Document 1: Japanese Laid-open Patent Publication No. 2011-199428

Before an update of the distortion compensation coefficients, i.e., before comparing a transmission baseband signal used as the reference signal with a feedback signal, an adjustment process that corrects a phase difference between both the signals and matches the phases is performed. In this phase adjustment process, a cumulative value is calculated related to each of a sample group that is associated with a transmission baseband signal (i.e., an input signal of an amplifier) and a sample group that is associated with a feedback signal (i.e., an output signal of the amplifier) and then the phase difference between both the signals is calculated by using the obtained cumulative value. Then, in the phase adjustment process, the phase difference between both the signals is corrected by using a correction amount that is calculated from the phase difference. Because the phase characteristic of the amplifier in a device varies in accordance with the ON/OFF state of the amplifier, the phase adjustment process is sequentially performed on both the signals.

However, in an amplifier, a phenomenon called a transient response of an idling current (Idq), i.e., "Idq drift", may sometimes be generated. The idling current (Idq) is a drain current in an idling state (i.e., a state in which no signal is input to an amplifier). If the Idq drift is generated, the input/output characteristic of the amplifier is changed and a difference between the electrical power or between the phases between a sample group that is associated with the input signal of the amplifier and a sample group that is associated with the output signal of the amplifier is increased. Consequently, in the phase adjustment process, it is difficult to calculate a phase difference between the input/output signals of the amplifier with high accuracy, as a result, it is difficult to correct the phase difference between the input/output signals of the amplifier with high accuracy. In particular, if a TDD (Time Division Duplex) system that repeats a transmission period and a reception period is used in a wireless device, because Idq drift tends to be generated immediately after the amplifier is turned ON in the transmission period, it is difficult to correct the phase difference between the input/output signals of the amplifier with high accuracy.

In contrast, it is conceivable to use a method that starts the phase adjustment process after predetermined standby time has elapsed since the time point at which the amplifier is turned ON. However, in this method, although the correction accuracy of the phase difference between the input/output signals of the amplifier is secured, the time at which the phase adjustment process is started is delayed by the time period corresponding to the standby time and, as a result, the time at which the distortion compensation coefficient is updated after the phase adjustment process may possibly be delayed.

SUMMARY

According to an aspect of an embodiment, a wireless device includes an amplifier that amplifies electrical power of a signal that is wirelessly transmitted; a calculating unit that calculates a cumulative value for each of first samples and second samples, between which a difference in electrical power or phase is within a first range, in a first sample group and a second sample group corresponding to a first signal that is a signal before amplification in the amplifier and a second signal that is a signal after amplification in the amplifier, respectively, and that calculates a phase difference between the first signal and the second signal by using the cumulative value; a correction unit that corrects the phase difference by using a correction amount calculated from the phase difference; and an updating unit that updates, by using the first signal and the second signal of which the phase difference is corrected, a distortion compensation coefficient that is used to compensate nonlinear distortion generated in the amplifier.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Figure 1:
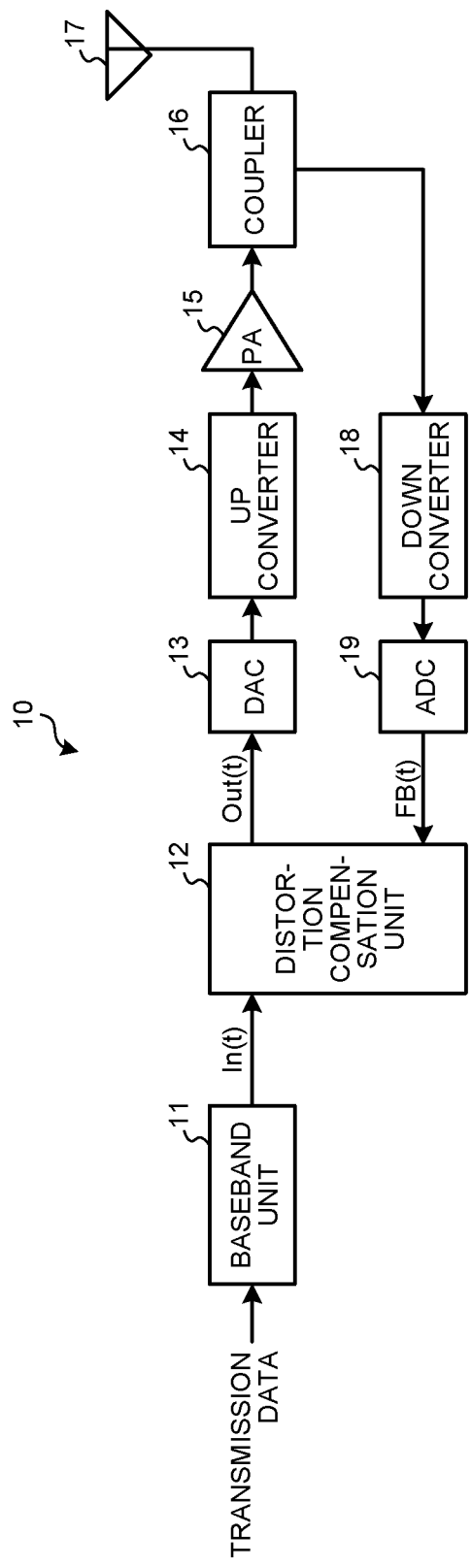
FIG. 1 is a block diagram illustrating a configuration example of a wireless device according to a first embodiment.

Preferred embodiments of the present invention will be explained with reference to accompanying drawings. The disclosed technology is not limited to the embodiments. Furthermore, in the embodiments described below, components having the same function are assigned the same reference numerals and descriptions of overlapped portions will be omitted.

[a] First Embodiment

Configuration of a Transmission Device

FIG. 1 is a block diagram illustrating a configuration example of a wireless device according to a first embodiment. In FIG. 1, a wireless device 10 includes a baseband unit 11, a distortion compensation unit 12, a digital-to-analog converter (DAC; digital-analog converter) 13, an up converter 14, a power amplifier (PA; electrical power amplifier) 15, and a coupler 16. Furthermore, the wireless device 10 includes an antenna 17, a down converter 18, and an analog-to-digital converter (ADC; analog-digital converter) 19. Furthermore, for the wireless device 10, the TDD (Time Division Duplex) system that repeats a transmission period for which wireless transmission is performed and a reception period for which wireless transmission is not performed is used.

The baseband unit 11 performs, in a transmission period in the TDD system, a baseband process, such as an encoding process, a modulation process, or the like, on input transmission data; generates a transmission baseband signal; and outputs the generated transmission baseband signal In(t) to the distortion compensation unit 12. The transmission baseband signal In(t) that is output from the baseband unit 11 includes an in-phase component (I component) and a quadrature component (Q component).

The distortion compensation unit 12 is a distortion compensation device used in a PD system and compensates the nonlinear distortion generated in the PA 15 by performing, using a distortion compensation coefficient, PD on the transmission baseband signal In(t). Namely, the distortion compensation unit 12 compensates the distortion generated in the signal after amplification in the PA 15. For example, the distortion compensation unit 12 generates a PD signal Out(t) by multiplying a distortion compensation coefficient by the transmission baseband signal In(t) and outputs the generated PD signal Out(t) to the DAC 13. Furthermore, the distortion compensation unit 12 corrects a phase difference between the transmission baseband signal In(t) that serves as the reference signal and a feedback signal FB(t) and then updates the distortion compensation coefficient by using the transmission baseband signal In(t) and the feedback signal FB(t) in which the phase difference has been corrected. The distortion compensation unit 12 will be described in detail later.

The DAC 13 converts the PD signal from the digital signal to the analog signal and outputs the converted PD signal to the up converter 14.

The up converter 14 up-converts an analog PD signal and outputs the up-converted PD signal to the PA 15.

The PA 15 amplifies the electrical power of the up-converted PD signal and outputs the signal in which the electrical power has been amplified to the coupler 16. The PA 15 is turned ON in a transmission period in, for example, the TDD system and turned OFF in a reception period in the TDD system.

The coupler 16 distributes the signal in which the electrical power has been amplified to the antenna 17 and to the down converter 18. Consequently, the signal that is output from the PA 15 is fed back to the distortion compensation unit 12 via the down converter 18 and the ADC 19.

The antenna 17 wirelessly transmits the signal in which the electrical power has been amplified.

The down converter 18 down-converts the signal that is input from the coupler 16 and then outputs the down-converted signal to the ADC 19.

The ADC 19 converts the down-converted signal from the analog signal to the digital signal and outputs the converted digital signal to the distortion compensation unit 12 as the feedback signal FB(t).

Configuration Example of the Distortion Compensation Unit

Figure 2:
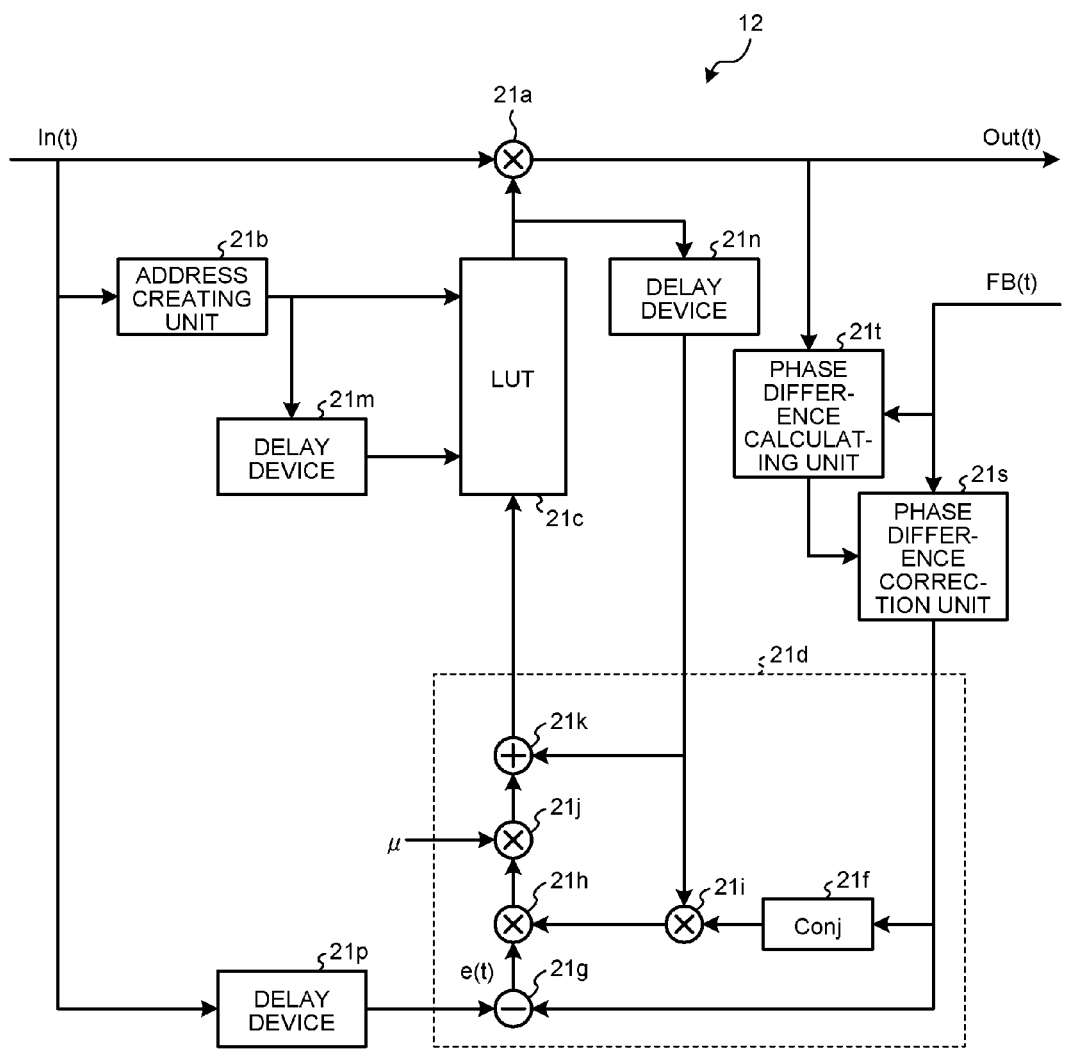
FIG. 2 is a block diagram illustrating a configuration example of a distortion compensation unit according to the first embodiment.

FIG. 2 is a block diagram illustrating a configuration example of a distortion compensation unit according to the first embodiment. In FIG. 2, the distortion compensation unit 12 includes an address creating unit 21$b$, delay devices 21$m$, 21$n$, and 21$p$, a look-up table (LUT) 21$c$, a multiplier 21$a$, a phase difference calculating unit 21$t$, a phase difference correction unit 21$s$, and a distortion compensation coefficient updating unit 21$d$.

The delay devices 21$m$, 21$n$, and 21$p$ are implemented by, for example, flip-flop circuits.

The address creating unit 21$b$ and the multiplier 21$a$ receive an input of the transmission baseband signal In(t). Furthermore, the delay device 21$p$ receives an input of the transmission baseband signal In(t) as the reference signal.

The address creating unit 21$b$ creates an address Adr(t) in accordance with the power value p of the transmission baseband signal In(t) and outputs the created address Adr(t) to the LUT 21$c$ as a read address AR. Furthermore, the address creating unit 21$b$ outputs the created address Adr(t) to the delay device 21$m$.

The delay device 21$m$ makes the address Adr(t) delay and outputs the delayed address Adr(t) to the LUT 21$c$ as a written address AW. Furthermore, the read address (AR) and the written address (AW) are the same address; however, because the arithmetic operation time is needed until an update value is obtained, the read address is delayed by using the delay device 21$m$ and is used as the written address.

The LUT 21$c$ stores therein a distortion compensation coefficient that is used to compensate the nonlinear distortion generated in the PA 15. The LUT 21$c$ outputs, to the multiplier 21$a$ and the delay device 21$n$, a distortion compensation coefficient hn−1(Adr) that is associated with the input read address AR. Furthermore, the LUT 21$c$ writes the distortion compensation coefficient, which is input from an adder 21$k$ in the distortion compensation coefficient updating unit 21$d$, in the written address AW that is input from the delay device 21$m$.

The multiplies 21$a$ generates a PD signal Out(t) by multiplying the transmission baseband signal In(t) and outputs the generated PD signal Out(t) to the DAC 13. The PD signal Out(t) is also input to the phase difference calculating unit 21$t$.

The delay device 21$p$ makes the transmission baseband signal In(t) that serves as the reference signal delay and then outputs the delayed reference signal to a subtractor 21$g$ in the distortion compensation coefficient updating unit 21$d$.

The phase difference calculating unit 21$t$ calculates a phase difference between the PD signal Out(t) (i.e., the transmission baseband signal In (t) that serves as the reference signal) and the feedback signal FB(t). Here, the PD signal Out(t) or the transmission baseband signal In(t) is an example of the signal before amplification in the PA 15 and the feedback signal FB(t) is an example of the signal after amplification in the PA 15. The phase difference calculating unit 21$t$ outputs the calculated phase difference to the phase difference correction unit 21$s$. Furthermore, calculation of the phase difference performed by the phase difference calculating unit 21$t$ will be described in detail later.

The phase difference correction unit 21$s$ corrects the phase difference between transmission baseband signal In(t) and the feedback signal FB(t) by using the correction amount that is in accordance with the phase difference calculated by the phase difference calculating unit 21$t$. For example, the correction of the phase difference is performed by the phase difference correction unit 21$s$ multiplying the feedback signal FB(t) by a twiddle factor that includes therein, as an angle of rotation, a value obtained by inverting the sign of the phase difference calculated by the phase difference calculating unit 21$t$.

By using the transmission baseband signal In(t) and the feedback signal FB(t) in which the phase difference has been corrected by the phase difference correction unit 21$s$, the distortion compensation coefficient updating unit 21$d$ updates the distortion compensation coefficients stored in the LUT 21$c$. The distortion compensation coefficient updating unit 21$d$ includes the subtractor 21$g$, a conjugate complex signal output unit 21$f$, multipliers 21$h$, 21$i$, and 21$j$, and the adder 21$k$.

The subtractor 21$g$ calculates an error signal e(t) between the transmission baseband signal In(t) that is input from the delay device 21$p$ and the feedback signal FB(t) and then outputs the calculated error signal e(t) to the multiplier 21$h$.

The multiplier 21$i$ multiplies the distortion compensation coefficient hn−1(Adr) by the FB*(t) and obtains an output u*(t) (=hn−1(Adr)FB*(t)). The multiplier 21$h$ multiplies the error signal e(t) received from the subtractor 21$g$ by u*(t). The multiplier 21$j$ multiplies a step size parameter $\mu$ by an output of the multiplier 21$h$.

The adder 21$k$ adds the distortion compensation coefficient hn−1(Adr) to an output $\mu$e(t)u*(t) of the multiplier 21$j$ and then outputs "hn−1(Adr)+$\mu$e(t)u*(t)" that is the addition result to the LUT 21$c$ as an updated distortion compensation coefficient.

Furthermore, the delay devices 21$m$, 21$n$, and 21$p$ add, to the signal, a delay time D from when the transmission baseband signal In(t) is input until when the feedback signal FB(t) is input to the subtractor 21$g$. The delay time D that is set to the delay devices 21$m$, 21$n$, and 21$p$ is determined to satisfy, for example, D=D0+D1, where a delay time of the PA 15 is D0 and a delay time of the feedback system is D1.

With this configuration, an arithmetic operation indicated below is perforated.

$$hn(\text{Adr}) = hn-1(\text{Adr}) + \mu e(t) u^*(t)$$

$$e(t) = In(t) - \text{FB}(t)$$

$$\text{FB}(t) = hn-1)(\text{Adr})In(t)F(\text{Adr})$$

$$u^*(t) = In(t)f(\text{Adr}) = hn-1(\text{Adr})\text{FB}^*(t)$$

where, In, FB, f, h, u, and e are complex numbers and * is a conjugate complex number. By performing the arithmetic operation process, the distortion compensation coefficient h(Adr) is updated such that the error signal e(t) between the transmission baseband signal In(t) and the feedback signal FB(t) is the minimum, the distortion compensation coefficient h(Adr) is finally converged on an optimal distortion compensation coefficient value, and the distortion in the PA 15 is compensated.

Operation Example of the Wireless Device

Figure 3:
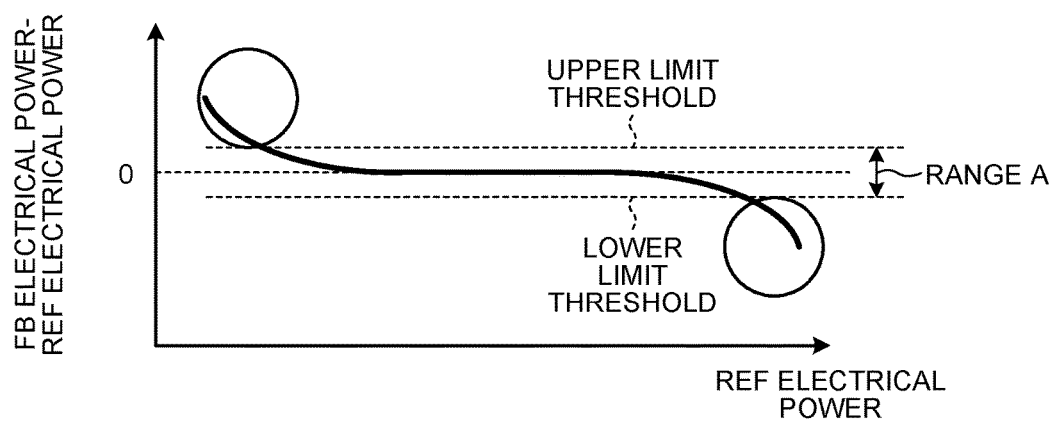
FIG. 3 is a schematic diagram used for an explanation of an operation example of the wireless device according to the first embodiment.

FIG. 3 is a schematic diagram used for an explanation of an operation example of the wireless device according to the first embodiment. In the following, in particular, a phase difference calculating process performed by the phase difference calculating unit 21*t* will be described. In FIG. 3, the vertical axis indicates a difference between the REF electrical power that is the electrical power of each of the first samples in a first sample group associated with the PD signal Out(t) that serves as the reference signal and the FB electrical power that is the electrical power of each of the second samples in the second sample group that is associated with the feedback signal FB(t). Furthermore, in FIG. 3, the horizontal axis indicates the REF electrical power.

A illustrated in FIG. 3, the phase difference calculating unit 21*t* calculates the cumulative value related to each of the first and the second samples, in which the difference between the electrical power is within the "first range" A, in "the first and the second sample groups" that are associated with the PD signal Out(t) and the feedback signal FB(t), respectively. The "first range" A is a numerical range between the lower limit threshold and the upper limit threshold. Namely, the phase difference calculating unit 21*t* selects, as the "cumulative target", the first and the second sample, in which the difference between the electrical power is within the "first range" A, in the "first and the second sample groups" and excludes, from the "cumulative target", the first and the second sample, in which the difference between the electrical power is not within the "first range" A. The first and the second samples enclosed by the circle illustrated in FIG. 3 correspond to the first and the second samples that are excluded from the "cumulative target".

Subsequently, the phase difference calculating unit 21*t* calculates, by using the calculated cumulative values, the phase difference between the PD signal Out(t) (i.e., the transmission baseband signal In(t) that serves as the reference signal) and the feedback signal FB(t). For example, the phase difference calculating unit 21*t* calculates the phase of the transmission baseband signal and the phase of the feedback signal by applying each of the cumulative values to the inverse tangent function and then calculates the phase difference by subtracting the phase of the transmission baseband signal from the phase of the feedback signal.

Processing Example of the Wireless Device

Figure 4:
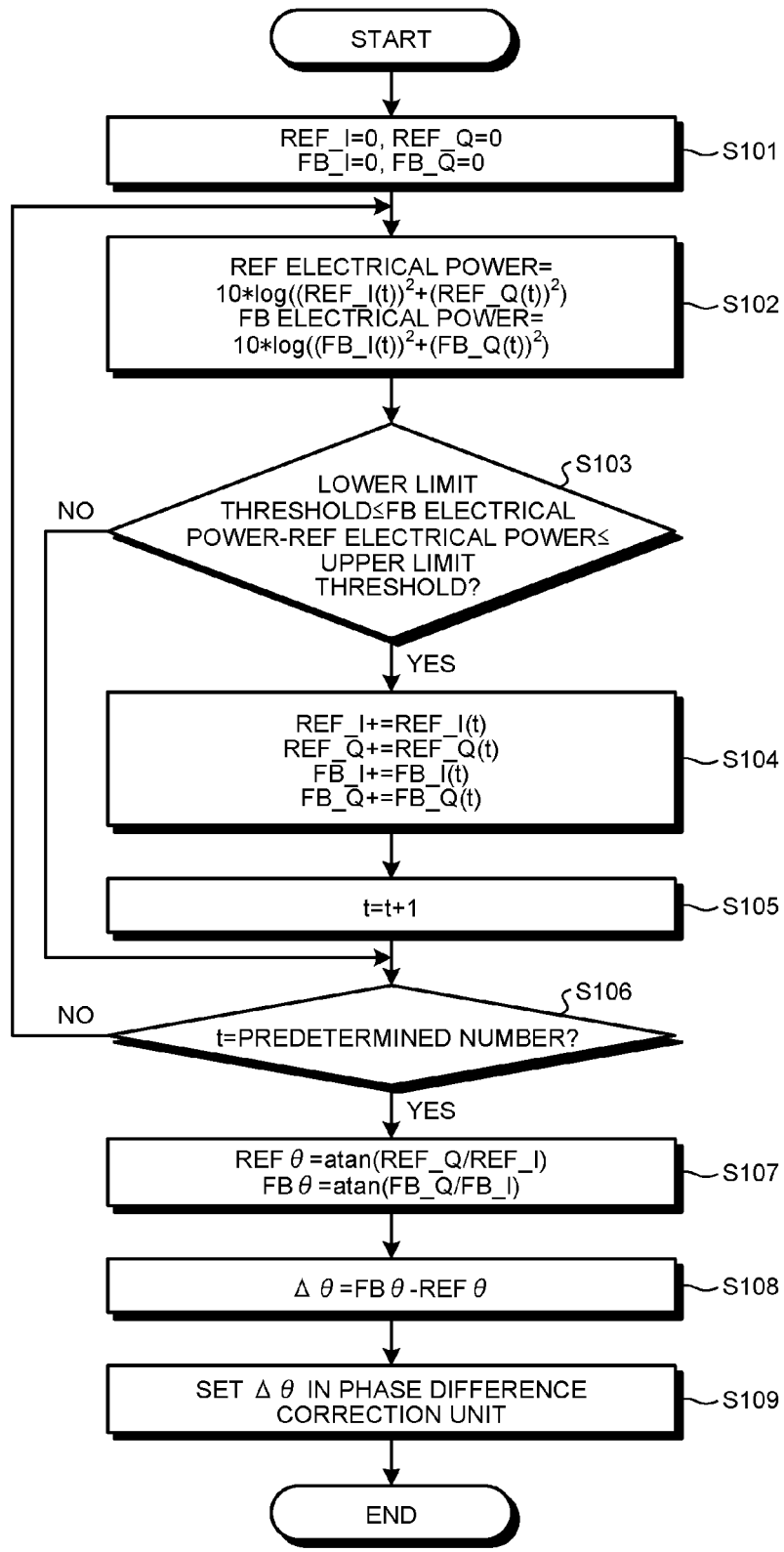
FIG. 4 is a flowchart illustrating the flow of a processing example of the wireless device according to the first embodiment.

A description will be given of the processing example of the wireless device 10 having the configuration described above. In particular, in the following, a phase difference calculation process performed by the phase difference calculating unit 21*t* in the wireless device 10 will be described. FIG. 4 is a flowchart illustrating the flow of a processing example of the wireless device according to the first embodiment. The flowchart illustrated in FIG. 4 is performed every time, for example, the transmission period in the TDD system arrives. Furthermore, in FIG. 4, "REF_I" represents the cumulative value of the I component REF_I(t) in the first sample associated with the PD signal Out(t) and "REF_Q" represents the cumulative value of the Q component REF_Q (t) in the first sample associated with the PD signal Out(t). Furthermore, in FIG. 4, "FB_I" represents the cumulative value of the I component FB_I(t) in the second sample associated with the feedback signal FB(t) and "FB_Q" represents the cumulative value of the Q component FB_Q (t) in the second sample associated with the feedback signal FB(t).

The phase difference calculating unit 21*t* initializes each of the cumulative values (Step S101).

The phase difference calculating unit 21*t* calculates the REF electrical power that is the electrical power of each of the first samples in the first sample group associated with the FD signal Out(t) serving as the reference signal and calculates the FB electrical power that is the electrical power of each of the second samples of the second sample group associated with the feedback signal FB(t) (Step S102). The phase difference calculating unit 21*t* calculates the difference between the REF electrical power and the FB electrical power, i.e., (FB electrical power-REF electrical power).

The phase difference calculating unit 21*t* determines whether (FB electrical power-REF electrical power) is within the "first range" (Step S103). The "first range" is a numerical range between the lower limit threshold and upper limit threshold.

If (FB electrical power-REF electrical power) is within the "first range" (Yes at Step S103), the phase difference calculating unit 21*t* selects the first and the second sample as the "cumulative target" and calculates the cumulative value related to each of the first and the second samples (Step S104). Namely, the following arithmetic operations are performed, as the calculation of the cumulative values.

$$REF\_I = REF\_I + REF\_I(t)$$

$$REF\_Q = REF\_Q + REF\_Q(t)$$

$$FB\_I = FB\_I + FB\_I(t)$$

$$FB\_Q = FB\_Q + FB\_Q(t)$$

If the phase difference calculating unit 21*t* performs the calculation of the cumulative value, the phase difference calculating unit 21*t* increments the number of samples t in the first and the second samples (Step S105).

In contrast, if (FB electrical power-REF electrical power) is not within the "first range" (No at Step S103), the phase difference calculating unit 21*t* excludes the first and the second samples from the "cumulative target". Namely, the processing step proceeds to Step S106.

If the number of samples t in the first, and the second samples does not reach a predetermined number (No at Step S106), the phase difference calculating unit 21*t* returns the process to Step S102. If the number of samples t in the first and the second samples reaches the predetermined number (Yes at Step S106), the phase difference calculating unit 21*t* performs the following process. Namely, the phase difference calculating unit 21*t* applies each of the cumulative values to the inverse tangent function and calculates, the phase REP θ of the PD signal Out(t) (i.e., the transmission baseband signal In(t) that serves as the reference signal) and the phase FB θ of the feedback signal FB(t) (Step S107).

The phase difference calculating unit, 21*t* subtracts the phase REFθ of the transmission baseband signal from the phase FB θ of the feedback signal and calculates the phase difference Δθ (Step S108). The phase difference calculating unit 21t sets the calculated phase difference Δθ in the phase difference correction unit 21s (Step S109).

As described above, the wireless device 10 according to the first embodiment includes the PA 15, the phase difference calculating unit 21t, and the phase difference correction unit 21s. The PA 15 amplifies the electrical power of the signal that is wirelessly transmitted. The phase difference calculating unit 21t calculates the cumulative value for each of the first samples and the second samples, between which the difference in electrical power is within the first range, in the first sample group and the second sample group corresponding to the signal before amplification in the PA 15 and the signal after amplification in the PA 15, respectively. Then, by using the calculated cumulative values, the phase difference calculating unit 21t calculates the phase difference between the signal before the amplification in the PA 15 and the signal after the amplification in the PA 15. The phase difference correction unit 21s updates, by using the signal before the amplification in the PA and the signal after the amplification in the PA 15 of which the phase difference is corrected, the distortion compensation coefficient that is used to compensate the nonlinear distortion generated in the PA 15.

With this configuration, because the first and the second samples, in which the difference between the electrical power is not within the first range, is excluded from the cumulative target, it is possible to suppress the difference between the electrical power in the first sample group and the second sample group and it is possible to correct the phase difference between the input/output signals in the PA 15 with high accuracy. Furthermore, with this configuration, because the phase adjustment process can be started at the time point at which the PA 15 is turned ON, it is possible to accelerate the time at which an update of the distortion compensation coefficient is stared when compared with the method that starts the phase adjustment process after a predetermined standby time has elapsed after the time point at which the PA 15 is turned. ON. Namely, according to the first, embodiment, it is possible to accelerate the time vat which an update of the distortion compensation coefficient is stared while correcting the phase difference between the input/output signals in the PA 15 with high accuracy.

First Modification

In the first embodiment described, above, a description has been given of an example in which the phase difference calculating unit 21t calculates the cumulative value of each of the first and the second samples, in which a difference between the electrical power is within the first range, in the first and the second sample groups associated with the signal before amplification in the PA and the signal after amplification in the PA 15, respectively. However, the disclosed technology is not limited to this. The phase difference calculating unit 21t may also calculate the cumulative value related to each of the first and the second; samples, in which a difference between the phases is within the first range, in the first and the second sample groups associated with the signal before the amplification in the PA 15 and the signal after the amplification in the PA 15, respectively. Consequently, the same effect as that described in the first embodiment is obtained.

Figure 5:
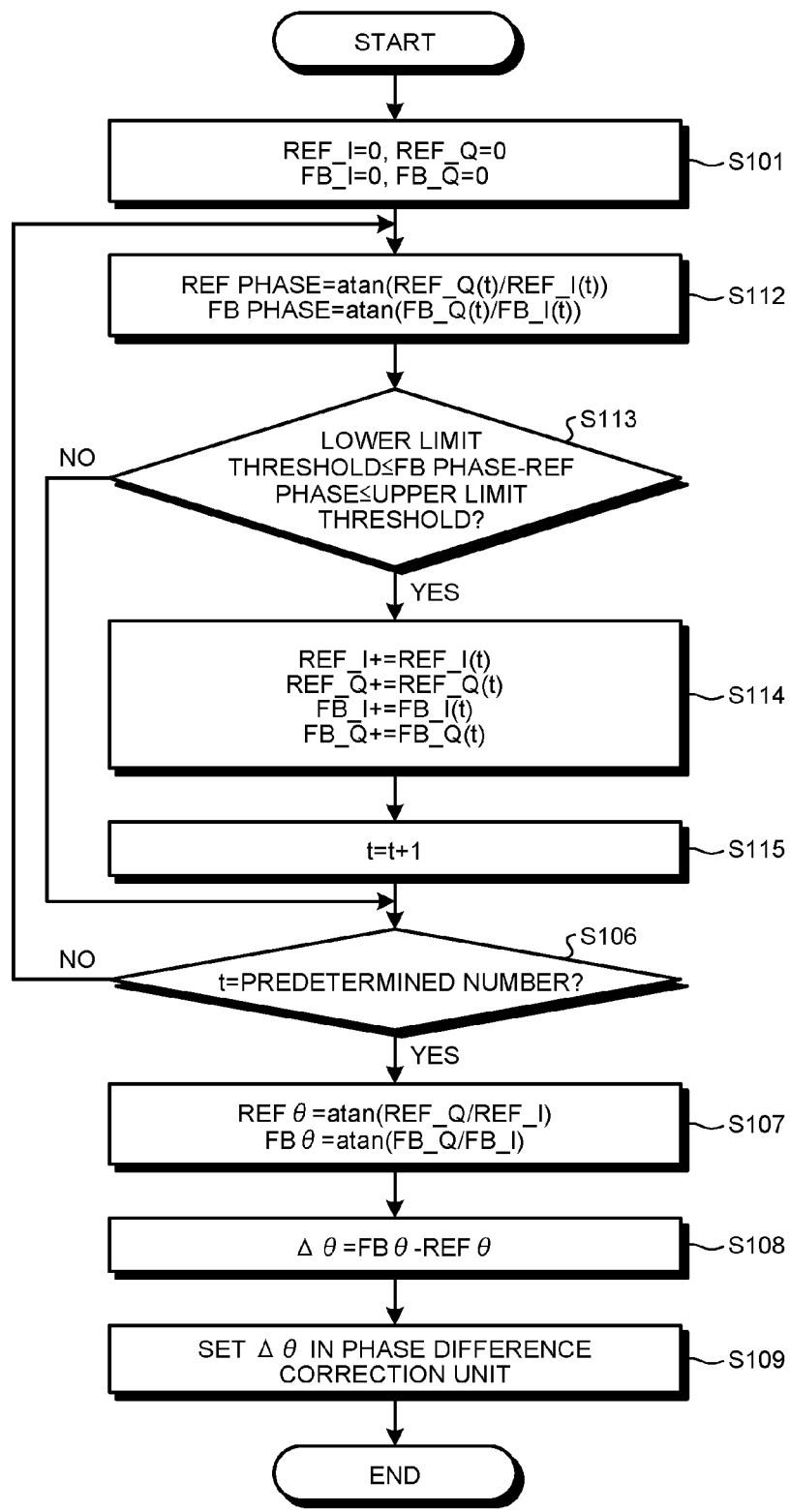
FIG. 5 is a flowchart illustrating the flow of a processing example of the wireless device according to a first modification.

FIG. 5 is a flowchart illustrating the flow of a processing example of the wireless device according to a first modification. The flowchart illustrated in FIG. 5 is performed every time when the transmission period in, for example, the TDD system arrives. Furthermore, in FIG. 5, "REF_I" represents the cumulative value of the I component REF_I(t) in the first sample associated with, the PD signal Out(t) and "REF_Q" represents the cumulative value of the Q component REF_Q (t) in the first sample associated with the PD signal Out(t). Furthermore, in FIG. 5, "FB_I" represents the cumulative value of the I component FB_I(t) in the second sample associated with the feedback signal FB(t) and "FB_Q" represents the cumulative value of the Q component FB_Q (t) in the second sample associated with the feedback signal FB(t).

In FIG. 5, because the processes performed at Steps S101, S106 to S109 are the same as those described in the first embodiment, descriptions thereof will be omitted.

The phase difference calculating unit 21t calculates the REF phase that is the phase of each of the first samples in the first sample group associated with the PD signal Out(t) that serves as the reference signal and calculates the FB phase that is the phase of each of the second samples in the second sample group associated with the feedback signal FB(t) (Step S112). The phase difference calculating unit 21t calculates the difference between the REF phase and the FB phase, i.e., (FB phase-REF phase).

The phase difference calculating unit 21t determines whether (FB phase-REF phase) is within the "first range" (Step S113). The "first range" is a numerical, range between the lower limit threshold and the upper limit threshold.

If (FB phase-REF phase) is within the "first range" (Yes at Step S113), the phase difference calculating unit 21t selects the first and the second samples as the "cumulative target" and calculates the cumulative value related to each of the first and the second samples (Step (S114). Namely, the following arithmetic operations are performed as the calculation of the cumulative value.

$$REF\_I=REF\_I+REF\_I(t)$$

$$REF\_Q=REF\_Q+REF\_Q(t)$$

$$FB\_I=FB\_I+FB\_I(t)$$

$$FB\_Q=FB\_Q+FB\_Q(t)$$

When the phase difference calculating unit 21t calculates the cumulative values, the phase difference calculating unit 21t increments the number of samples t in the first and the second samples (Step S115).

In contrast, if (FB phase-REF phase) is not within the "first range" (No at Step S113), the phase difference calculating unit 21t excludes the first and the second samples from the "cumulative target". Namely, the processing step proceeds to Step S106.

[b] Second Embodiment in a second embodiment, in accordance with the electrical power of each of the first samples in the first sample group associated with the signal before amplification in the PA 15 (i.e., the PD signal Out(t)), at least one of upper limit threshold and the lower limit threshold in the "first range" described above is changed. Furthermore, the basic configuration of a wireless device and a distortion compensation unit according to the second embodiment is the same as that of the wireless device 10 and the distortion compensation unit 12 described in the first embodiment; therefore, descriptions thereof will be given with reference to FIGS. 1 and 2.

Configuration Example of the Wireless Device and the Distortion Compensation Unit In the wireless device 10 according to the second embodiment, the phase difference calculating unit 21t changes, in accordance with the electrical power of each of the first samples in the first, sample group associated with the PD signal Out(t), at least one of the upper limit threshold and the lower limit threshold in the "first range" described above. Then, after the phase difference calculating unit 21t changes at least one of the upper limit threshold and the lower limit threshold in the "first range" described above, the phase difference calculating unit 21t calculates the phase difference between the PD signal Out(t) (i.e., the transmission baseband signal In(t) that serves as the reference signal) and the feedback signal FB(t).

Operation Example of the Wireless Device

Figure 6:
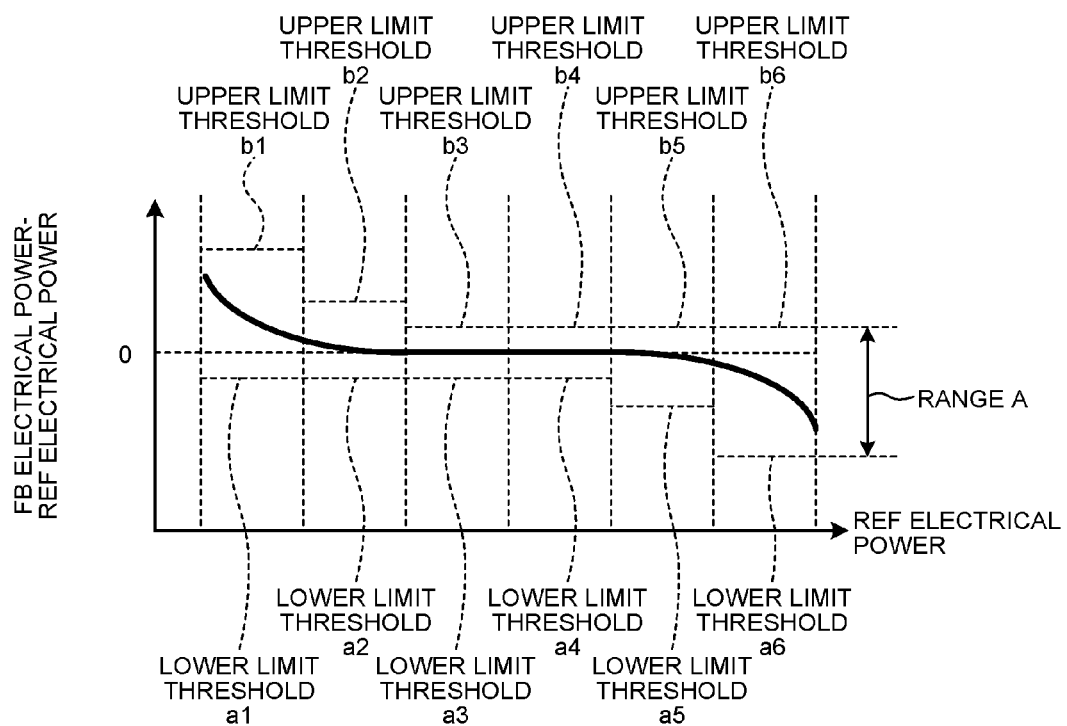
FIG. 6 is a schematic diagram used for an explanation of an operation example of a wireless device according to a second embodiment.

FIG. 6 is a schematic diagram used for an explanation of an operation example of a wireless device according to a second embodiment. In the following, in particular, a phase difference calculation process performed by the phase difference calculating unit 21t will be described. In FIG. 6, the vertical axis indicates a difference between the REF electrical power that is the electrical power of each of the first samples in the first sample group associated with the PD signal Out(t) that serves as the reference signal and the FB electrical power that is the electrical power of each of the second samples in the second sample group associated with the feedback signal FB(t). Furthermore, in FIG. 6, the horizontal axis indicates the REF electrical power.

As illustrated in FIG. 6, the phase difference calculating unit 21t changes, in accordance with the electrical power of each of the first samples in the first sample group associated with the PD signal Out(t), at least one of the upper limit threshold and the lower limit threshold in a "first range" A. In the example illustrated in FIG. 6, the phase difference calculating unit 21t increases the upper limit threshold in the "first range" A as the electrical power of each of the first samples in the first sample group associated with the PD signal Out(t) is decreased. Furthermore, in the example illustrated in FIG. 6, the phase difference calculating unit 21t decreases the lower limit threshold in the "first range" A described above as the electrical power of each of the first samples in the first sample group associated with the PD signal Out(t) is increased.

Then, the phase difference calculating unit 21t calculates the cumulative value related to each of the first and the second samples, in which the difference between the electrical power is within the "first range" A, in "the first and the second sample groups" associated with the PD signal Out(t) and the feedback signal FB(t), respectively. At this point, as described above, in accordance with the electrical power of each of the first samples in the first sample group associated with the PD signal Out(t), at least one of the upper limit threshold and the lower limit threshold in the "first range" A is changed. Consequently, because the time period for which the number of samples of each of the first and the second samples in which the difference between the electrical power is within the "first range" A reaches the predetermined number is reduced, the time period for which the cumulative values are calculated, is reduced and, as a result, the time needed to calculate the phase difference is reduced.

Subsequently, the phase difference calculating unit 21t calculates, by using the calculated cumulative values, the phase difference between the PD signal Out(t) (i.e., the transmission baseband signal In(t) that serves as the reference signal) and the feedback signal FB(t). For example, the phase difference calculating unit 21t calculates the phase of the transmission baseband signal and the phase of the feedback signal by applying each of the cumulative values to the inverse tangent function and subtracts the phase of the transmission baseband signal from the phase of the feedback signal, thereby calculating the phase difference.

Processing Example of the Wireless Device

Figure 7:
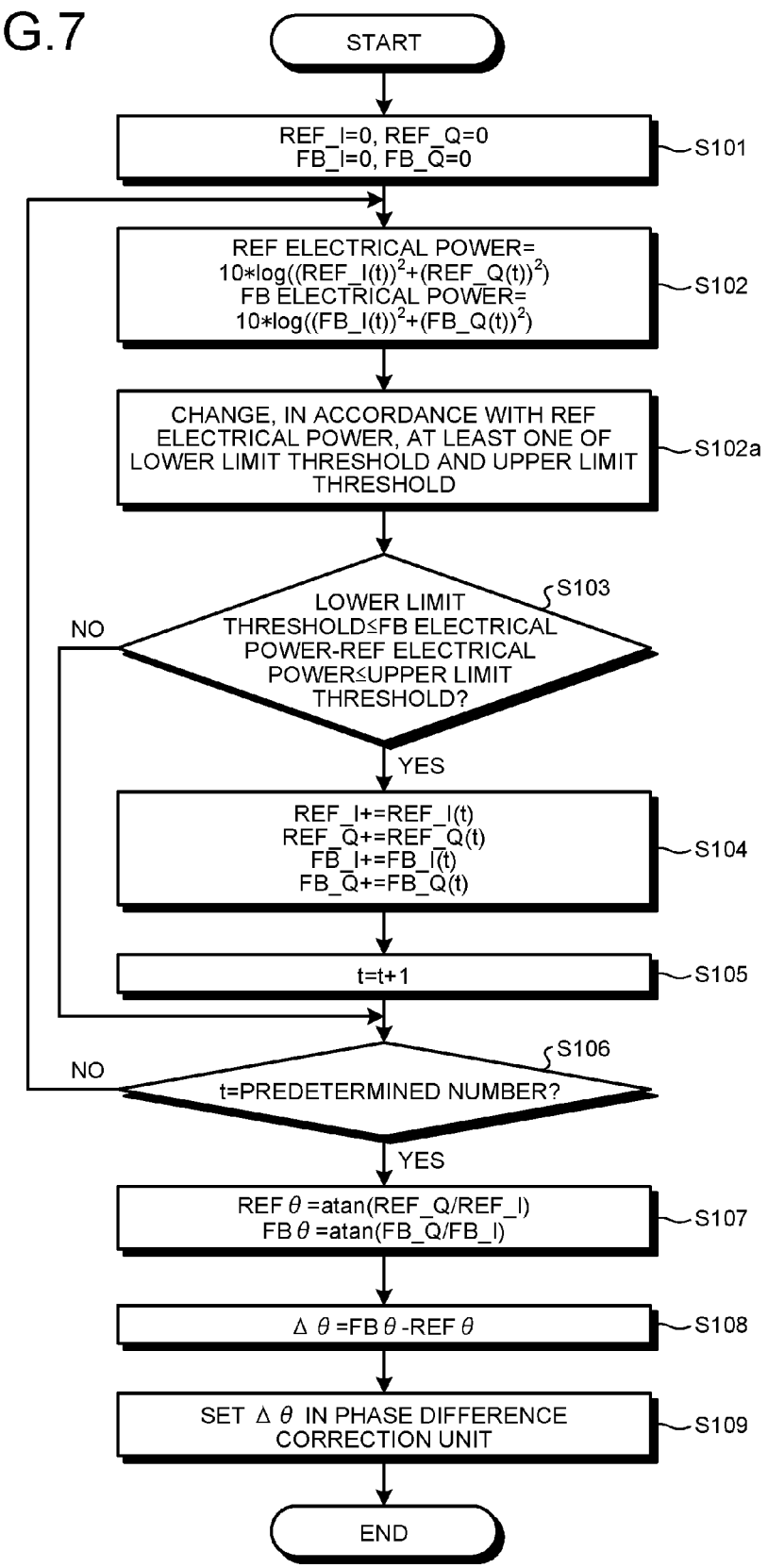
FIG. 7 is a flowchart illustrating the flow of a processing example of the wireless device according to the second embodiment.

FIG. 7 is a flowchart illustrating the flow of a processing example of the wireless device according to the second embodiment. The flowchart illustrated in FIG. 7 is performed every time the transmission period in, for example, the TDD system arrives. Furthermore, in FIG. 7, "REF_I" represents the cumulative value of the I component REF_I(t) in the first sample associated with the PD signal Out(t) and "REF_Q" represents the cumulative value of the Q component REF_Q(t) in the first sample associated with the PD signal Out(t). Furthermore, in FIG. 7, "FB_I" represents the cumulative value of the I component FB_I(t) in the second sample associated with the feedback signal FB(t) and "FB_Q" represents the cumulative value of the Q component FB_Q(t) in the second sample associated with the feedback signal FB(t).

In FIG. 7, processes performed at Steps S101 to S109 are the same as those performed in the first embodiment; therefore, descriptions thereof will be omitted.

When the phase difference calculating unit 21t calculates the REF electrical power and the FB electrical power at Step S102, the phase difference calculating unit 21t changes, in accordance with the REF electrical power, at least one of the lower limit threshold and the upper limit threshold in the "first range" (Step S102a). The phase difference calculating unit 21t calculates the difference between the REF electrical power and the FB electrical power, i.e., (FB electrical power-REF electrical power). Then, the processing step proceeds to Step S103.

As described above, the wireless device 10 in the second embodiment includes the PA 15, the phase difference calculating unit 21t, and the phase difference correction unit 21s. The PA 15 amplifies the electrical power of the signal that is wirelessly transmitted. The phase difference calculating unit 21t calculates the cumulative value of each of the first samples and the second samples, between which the difference in the electrical power is within the first range, in the first sample group and the second sample group corresponding to the signal before amplification in the PA 15 and the signal after amplification in the PA 15, respectively. Then, the phase difference calculating unit 21t calculates, by using the calculated cumulative values, the phase difference between the signal before the amplification in the PA 15 and the signal after the amplification in the PA 15. The phase difference correction unit 21s updates, by using the signal before the amplification in the PA 15 and the signal after the amplification in the PA 15 of which the phase difference is corrected, the distortion compensation coefficient that is used to correct the nonlinear distortion in the PA 15.

With this configuration, because the first and the second samples in which the difference between the electrical power is not within the first range are excluded from the cumulative target, it is possible to suppress the difference between the electrical power between the first sample group and the second sample group and it is possible to calculate and correct the phase difference between the input/output signals in the PA 15 with high accuracy. Furthermore, with this configuration, because the phase adjustment process can be started at the time point at which the PA 15 is turned ON, it is possible to accelerate the time at which an update of the distortion compensation coefficient is stared when compared with the method that starts the phase adjustment process after a predetermined standby time has elapsed after the time point at which the PA 15 is turned ON. Namely, according no the second embodiment, it is possible to accelerate the time at which an update of the distortion compensation coefficient is stared while correcting the phase difference between the input/output signals in the PA 15 with high accuracy.

Furthermore, in the wireless device 20 according to the second embodiment, the phase difference calculating unit 21t changes, in accordance with the electrical power of each of the first samples in the first sample group associated with the signal before amplification in the PA 15, the upper limit threshold or the lower limit threshold or a combination thereof in the "first range", With this configuration, because the time period for which the number of samples of each of the first and the second samples in which the difference between the electrical power is within the "first range" reaches the predetermined number is reduced, the time period for which the cumulative values are calculated is reduced and, as a result, the time needed to calculate the phase difference is reduced. Consequently, according to the second embodiment, because the time period from when the PA 15 is turned ON until when the phase adjustment process has been completed is reduced, the time at which an update of the distortion compensation coefficient is started can be accelerated further more.

Second Modification

In the second embodiment described above, a description has been given of an example in which the phase difference calculating unit 21t calculates the cumulative value of each of the first and the second samples, in which the difference between electrical power is within the first range, in the first and the second, sample groups associated with the signal before amplification in the PA 15 and the signal after amplification in the PA 15, respectively. However, the disclosed technology is not limited to this. The phase difference calculating unit 21t may also calculate the cumulative value of each of the first and the second samples, in which the difference between the phases is within the first range, in the first and the second sample groups associated with the signal before amplification in the PA 15 and the signal after amplification in the PA 15, respectively. Consequently, it is possible to obtain the same effect as that obtained in the second embodiment.

Figure 8:
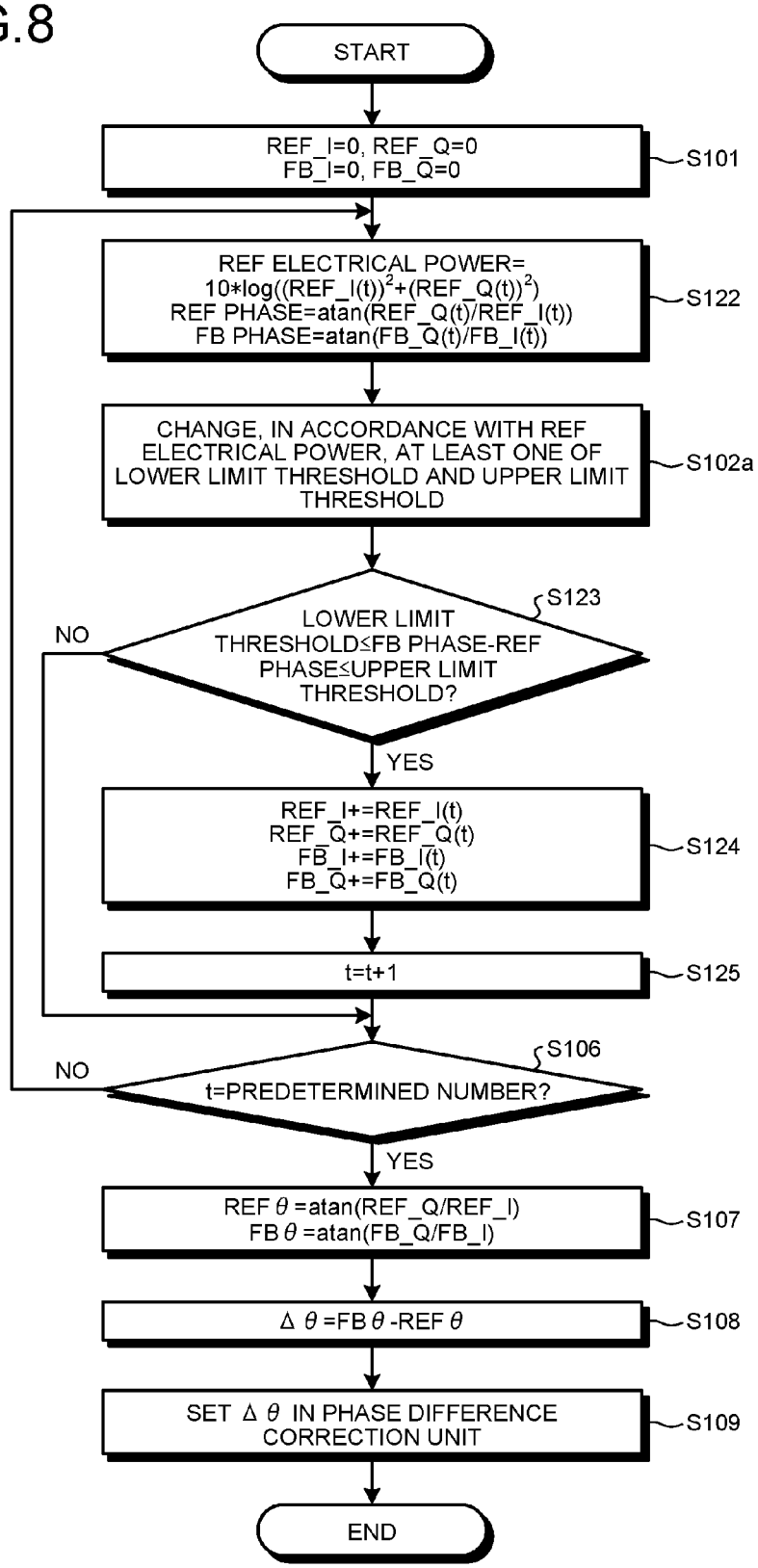
FIG. 8 is a flowchart illustrating the flow of a processing example of the wireless device according to a second modification.

FIG. 8 is a flowchart illustrating the flow of a processing example of the wireless device according to a second modification. The flowchart illustrated in FIG. 8 is performed every time the transmission period in, for example, the TDD system arrives. Furthermore, in FIG. 8, "REF_I" represents the cumulative value of the I component REF_I(t) in the first sample associated with the PD signal Out(t) "REF_Q" represents the cumulative value of the Q component REF_Q(t) in the first sample associated with the PD signal Out(t). Furthermore, in FIG. 8, "FB_I" represents the cumulative value of the I component FB_I(t) in the second sample associated with the feedback signal FB(t) and "FB_Q" represents the cumulative value of the Q component FB_Q(t) in the second sample associated with the feedback signal FB(t).

In FIG. 8, the processes performed at Steps S101 and S106 to S109 are the same as those performed in the second embodiment; therefore, descriptions thereof will be omitted.

The phase difference calculating unit 21t calculates the REF electrical power, the REF phase, and the FB phase (Step S122). The REF electrical power is the electrical power of each of the first samples in the first sample group associated with the PD signal Out(t) that serves as the reference signal. The REF phase is the phase of each of the first samples in the first sample group associated with the PD signal Out(t) that serves as the reference signal. The FB phase is the phase of each of the second samples in the second sample group associated with the feedback signal FB(t).

When the phase difference calculating unit 21t calculates the REF electrical power, the REF phase, and the FB phase at Step S122, the phase difference calculating unit 21t changes, in accordance with the REF electrical power, at least one of the lower limit threshold and the upper limit threshold in the "first range" (Step S102a). The phase difference calculating unit 21t calculates the difference between the REF phase and the FB phase, i.e., (FB phase-REF phase).

The phase difference calculating unit 21t determines whether (FB phase-REF phase) is within the "first range" (Step S123). The "first range" is a numerical range between the lower limit threshold and the upper limit threshold.

If (FB phase-REF phase) is within the "first range" (Yes at Step S123), the phase difference calculating unit 21t selects the first and the second samples as the "cumulative target" and calculates the cumulative value related to each of the first and the second samples (Step S124). Namely, the following arithmetic operations are performed as the calculation of the cumulative values, REF_I=REF_I+REF_I(t)

REF_Q=REF_Q+REF_Q(t)

FB_I=FB_I+FB_I(t)

FB_Q=FB_Q+FB_Q(t)

When the phase difference calculating unit 21t calculates the cumulative values, the phase difference calculating unit 21t increments the number of samples t in the first and the second samples (Step S125).

In contrast, if (FB phase-REF phase) is not within the "first range" (No at Step S123), the phase difference calculating unit 21t excludes the first and the second samples from the "cumulative target". Namely, the processing step proceeds to Step S106.

[c] Third Embodiment

A third embodiment relates to variation of an update process of the distortion compensation coefficient. The basic configuration of a wireless device according to the third embodiment is the same as that of the wireless device 10 according to the first embodiment and the second embodiment.

Configuration Example of the Distortion Compensation Unit

Figure 9:
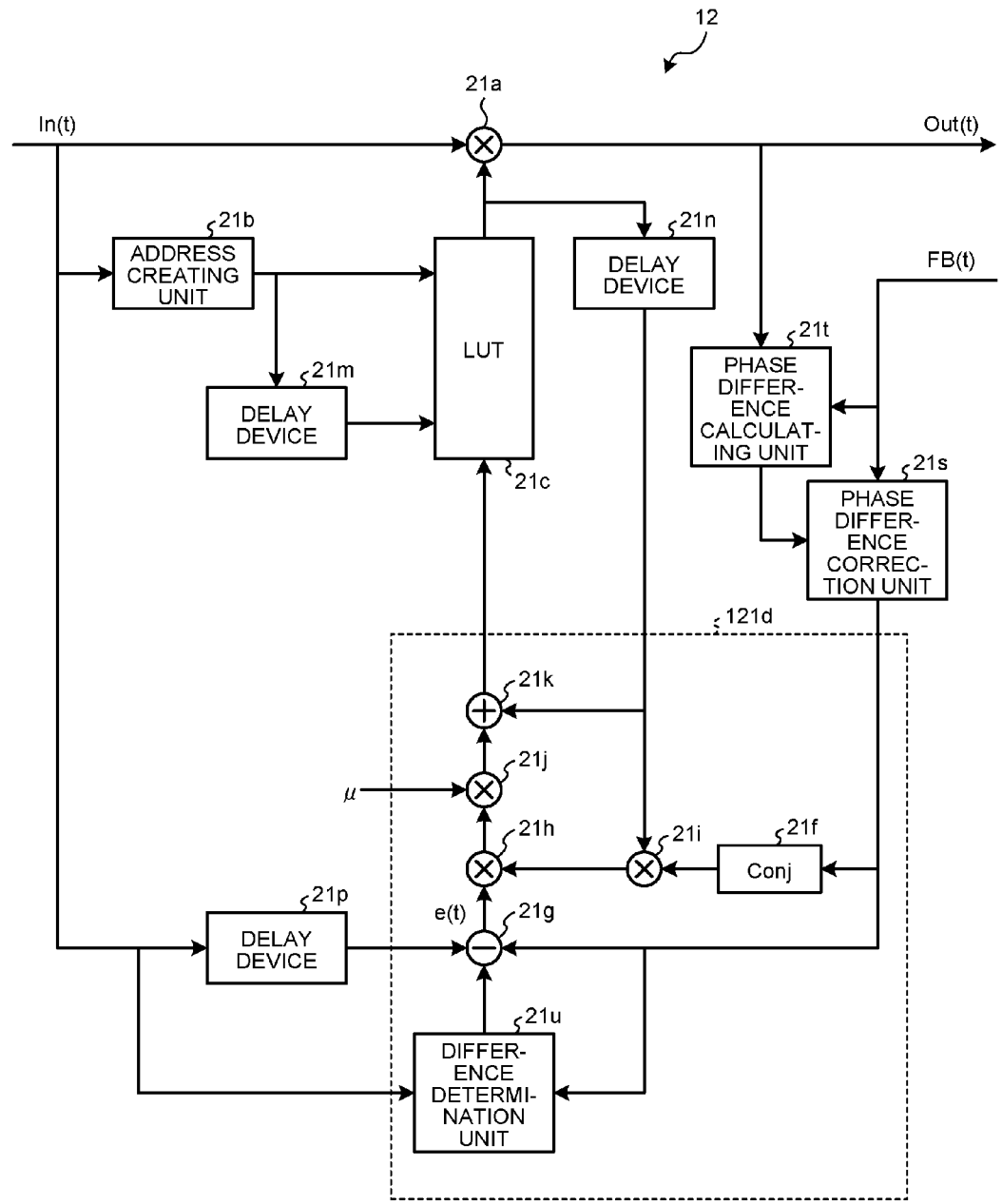
FIG. 9 is a block diagram illustrating a configuration example of a distortion compensation unit according to a third embodiment.

In the wireless device 10 according to the third embodiment, the distortion compensation unit 12 includes, as illustrated in FIG. 9, a distortion compensation coefficient updating unit 121d. FIG. 9 is a block diagram illustrating a configuration example of a distortion compensation unit according to a third embodiment.

The distortion compensation coefficient updating unit 121d updates, by using the transmission baseband signal In(t) and the feedback signal FB(t) in which the phase difference has been corrected by the phase difference correction unit 21s, the distortion compensation coefficients stored in the LUT 21c. The distortion compensation coefficient updating unit 121d updates the distortion compensation coefficients by using the first and the second samples, in which the difference between the electrical power is within a "second range", in the first and the second sample groups associated with the transmission baseband signal In(t) and the feedback signal FB(t), respectively, in which the phase difference has been corrected. The distortion compensation coefficient updating unit 121d includes the subtractor 21g, the conjugate complex signal output unit 21f, multipliers 21h, 21i, and 21j, the adder 21k, and a difference determination unit 21u.

The conjugate complex signal output unit 21f, the multipliers 21h, 21i, and 21j, and the adder 21k basically perform the same process as that performed by the conjugate complex signal output unit 21f, the multipliers 21h, 21i, and 21j, and the adder 21k, respectively, according to the first embodiment.

The subtractor 21g calculates an error signal e(t) between the transmission baseband signal In(t) that is input from the delay device 21p and the feedback signal FB(t) and then outputs the calculated error signal e(t) to the multiplier 21h. Furthermore, when the subtractor 21g receives a "switching control signal" from the difference determination unit 21u, the subtractor 21g forcibly sets the error signal e(t) to "0" and outputs "0" as the error signal e(t) to the multiplier 21h. When "0" is output as the error signal e(t), an output of the multipliers 21h and 21j becomes "0" and the addition result in the adder 21k becomes "hn−1 (Adr)" and, as a result, the updated distortion compensation coefficient that is output to the LUT 21c becomes "hn−1 (Adr)". Namely, because "0" is output as the error signal e(t), an update of the distortion compensation coefficients is forcibly stopped.

The difference determination unit 21u calculates the REF electrical power that is the electrical power of each of the first samples in the first sample group associated with the transmission baseband signal In(t) that serves as the reference signal and calculates the FB electrical power that is the electrical power of each of the second samples in the second sample group associated with the feedback signal FB(t). The difference determination unit 21u calculates the difference between the REF electrical power and the FB electrical power, i.e., (FB electrical power−REF electrical power). The "second range" is a numerical range between the lower limit threshold and the upper limit threshold. The difference determination unit 21a determines whether (FB electrical power−REF electrical power) is within the "second range". If (FB electrical power−REF electrical power) is within the "second range", the difference determination unit 21u allows the subtractor 21g to continuously output the error signal e(t). In contrast, if (FB electrical power−REF electrical power) is not within the "second range", the difference determination unit 21u allows, by using the "switching control signal" described above, the subtractor 21g to output "0" as the error signal e(t). Consequently, the distortion compensation coefficients are updated by using the first and the second samples, in which the difference between the electrical power is within the "second range", in the first and the second sample groups associated with the transmission baseband signal In(t) and feedback signal FB(t), respectively, in which the phase difference has been corrected.

Processing Example of the Wireless Device

Figure 10:
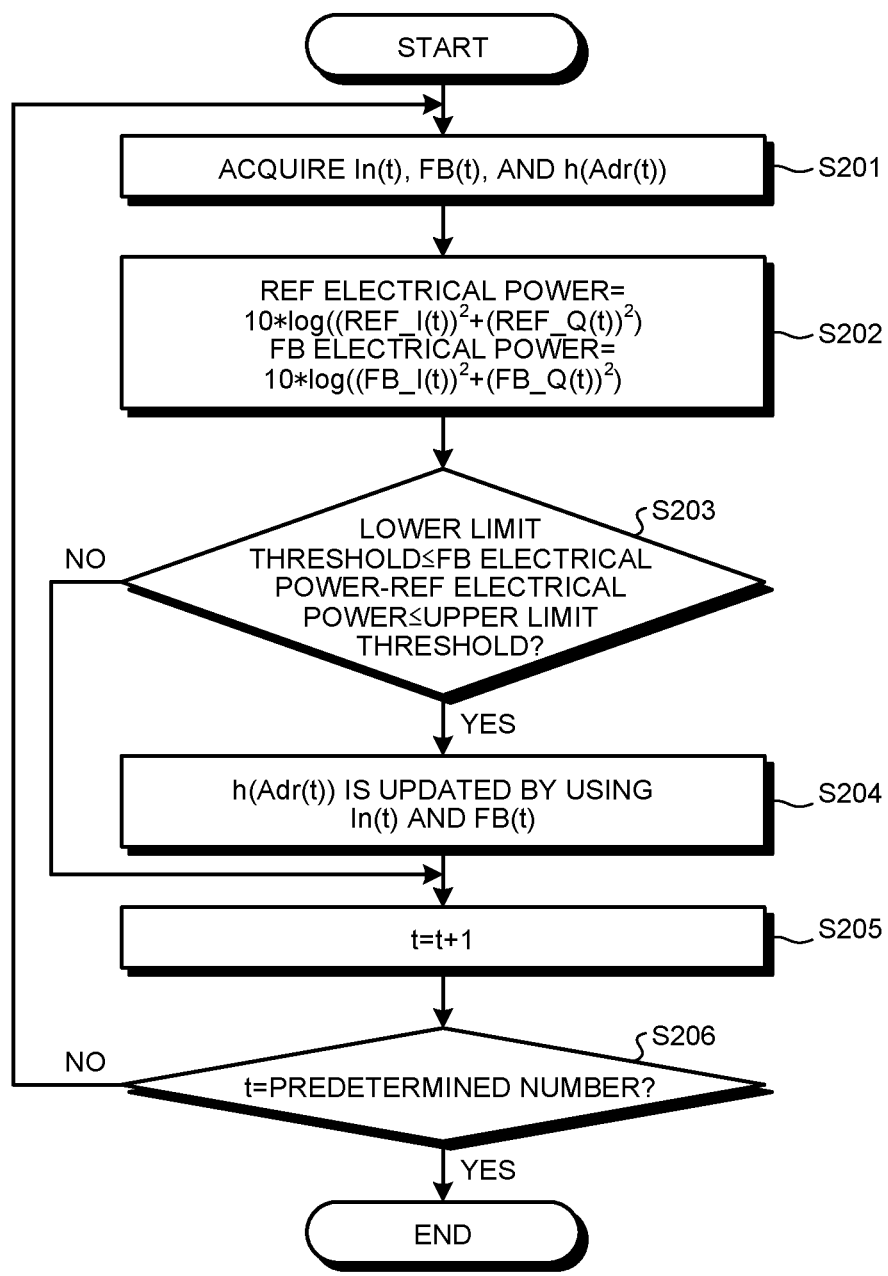
FIG. 10 is a flowchart illustrating the flow of a processing example of a wireless device according to the third embodiment.

A description will be given of a processing example of the wireless device 10 having the configuration described above. In particular, in the following, a distortion compensation coefficient updating process performed by the distortion compensation coefficient updating unit 121d in the wireless device 10 will be described. FIG. 10 is a flowchart illustrating the flow of a processing example of a wireless device according to the third embodiment.

The distortion compensation coefficient updating unit 121d acquires the transmission baseband signal In(t), the feedback signal FB(t), and the distortion compensation coefficient h(Adr(t)) (Step S201). Furthermore, the distortion compensation coefficient h(Adr(t)) is the distortion compensation coefficient that is obtained by reading, as the read address AR from the LUT 21c, the address Adr(t) associated with the power value of the transmission baseband signal In(t).

The difference determination unit 21u in the distortion compensation coefficient updating unit 121d performs the following process. The difference determination unit 21u calculates the REF electrical power that is the electrical power of each of the first samples in the first sample group associated with the transmission baseband signal In(t) and calculates the FB electrical power that is the electrical power of each of the second samples in the second sample group associated with the feedback signal FB(t) (Step S202). The difference determination unit 21u calculates the difference between the REF electrical power and the FB electrical power, i.e., (FB electrical power−REF electrical power).

The difference determination unit 21u determines whether (FB electrical power−REF electrical power) is within the "second range" (Step S203). The "second range" is a numerical range between the lower limit threshold and the upper limit threshold.

If (FB electrical power−REF electrical power) is within the "second range" (Yes at Step S203), the difference determination unit 21u continuously allows the subtractor 21g to output the error signal e(t). Consequently, the distortion compensation coefficient is updated by using the first and the second samples, in which difference between the electrical power is within the "second range", in the first and the second sample groups associated with the transmission baseband signal In(t) and the feedback signal FB(t), respectively, (Step S204).

In contrast, if (FB electrical power−REF electrical power) is not within the "second range" (No at Step S203), the difference determination unit 21u allows the subtractor 21g to output "0" as the error signal e(t). If "0" is output as the error signal e(t), an update of the distortion compensation coefficient is forcibly stopped. Namely, the first and the second samples, in which the difference between the electrical power is not within the "second range", in the first and the second sample groups associated with the transmission baseband signal In(t) and the feedback signal FB(t) are not applied to an update of the distortion compensation coefficients. Namely, the processing step is directly proceeds to Step S205 without passing through Step S204.

The distortion compensation coefficient updating unit 121d increments the number of samples t of the first and the second samples (Step S205).

If the number of samples t of the first and the second samples does not reach the predetermined number (No at Step S206), the distortion compensation coefficient updating unit 121d returns the process to Step S201. If the number of samples t of the first and the second samples reaches the predetermined number (Yes at Step S206), the distortion compensation coefficient updating unit 121d ends the distortion compensation coefficient updating process.

As described above, in the third embodiment, the distortion compensation coefficient updating unit 121d updates the distortion compensation coefficients by using the first samples and the second samples, between which the difference in the electrical power is within the second range, in the first sample group and the second sample group corresponding to the signal before amplification in the PA 15 and the signal after amplification in the PA 15, respectively.

With this configuration, because the first and the second samples, in which the difference between the electrical power is not within the second range, are not applied to an update of the distortion compensation coefficients, the distortion compensation coefficients can be updated with high accuracy. Furthermore, with this configuration, because the distortion compensation coefficient updating process can be started at the time point at which the PA 15 is turned ON, it is possible to accelerate the time at which an update of the distortion compensation coefficients is stared. Namely, according to the third embodiment, it is possible to update the distortion compensation coefficients with high accuracy while accelerating the time at which an update of the distortion compensation coefficients is stared.

Third Modification

In the third embodiment described above, a description has been given of an example in which the distortion compensation coefficient updating unit 121d update the distortion compensation coefficients by using the first and the second samples, in which the difference between the electrical power is within the second range, in the first and the second sample groups associated with the signal before amplification in the PA 15 and the signal after amplification in the PA 15, respectively. However, the disclosed technology is not limited to this. The distortion compensation coefficient updating unit 121d may also update the distortion compensation coefficients by using the first and the second samples, in which the difference between the phases is within the second range, in the first and the second sample groups associated with the signal before amplification in the PA 15 and the signal after amplification in the PA 15, respectively. Consequently, it is possible to obtain the same effect as that obtained in the third embodiment.

Figure 11:
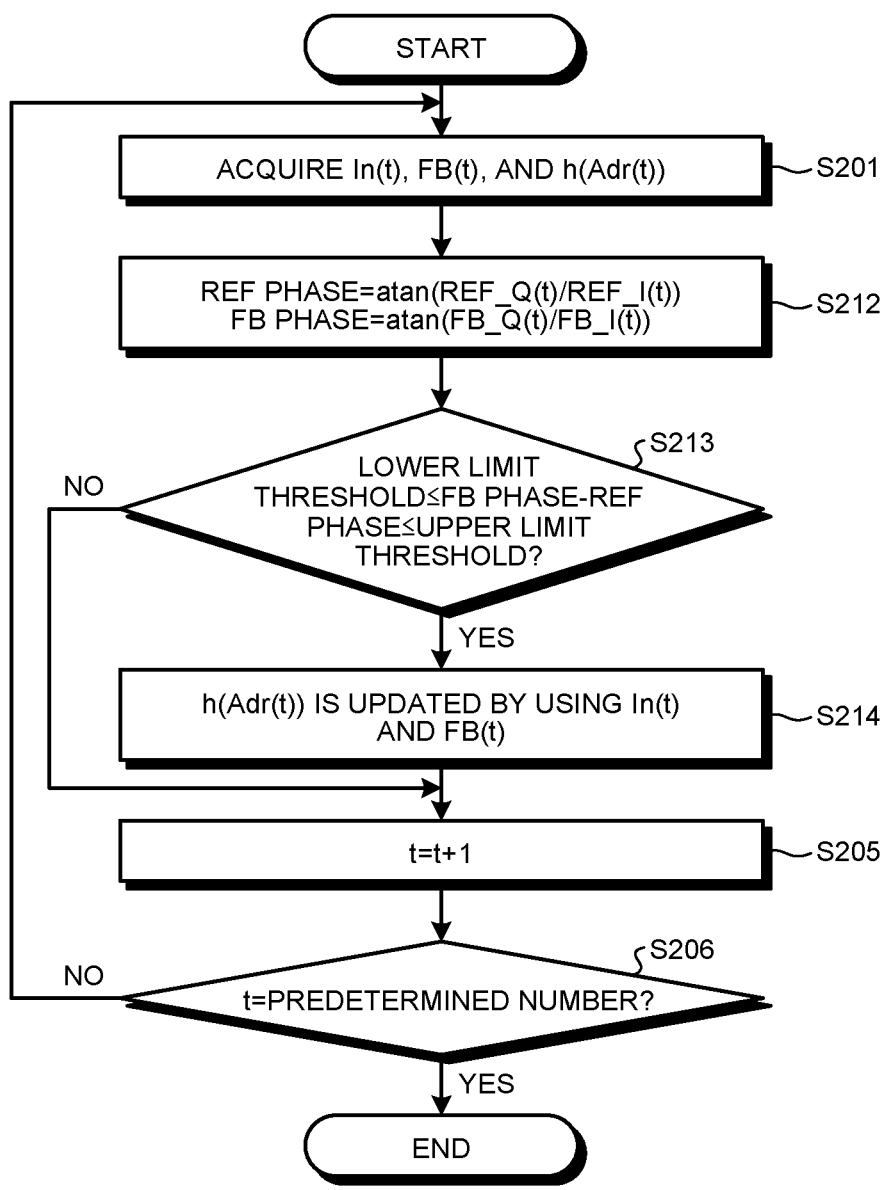
FIG. 11 is a flowchart illustrating the flow of a processing example of a wireless device according to a third modification.

FIG. 11 is a flowchart illustrating the flow of a processing example of a wireless device according to a third modification. In FIG. 11 the processes performed at Steps S201, S205, and S206 are the same as that performed in the third embodiment; therefore, descriptions thereof will be omitted.

If the transmission baseband signal In(t), the feedback signal FB(t), and the distortion compensation coefficient h(Adr(t)) are acquired (Step S201), the difference determination unit 21u in the distortion compensation coefficient updating unit 121d performs the following process. The difference determination unit 21u calculates REF phase that is the phase of each of the first samples in the first sample group associated with the transmission baseband signal In(t) and calculates the FB phase that is the phase of each of the second samples in the second sample group associated with the feedback signal FB(t) (Step S212). The difference determination unit 21u calculates the difference between the REF phase and the FB phase, i.e., (FB phase-REF phase).

The difference determination unit 21u determines whether (FB phase-REF phase) is within the "second range" (Step S213). The "second range" is a numerical range between the lower limit threshold and the upper limit threshold.

If (FB phase-REF phase) is within the "second range" (Yes at Step S213), the difference determination unit 21u allows the subtractor 21g to continuously output the error signal e(t). Consequently, the distortion compensation coefficient is updated by using the first and the second samples, in which the difference between the phases is within the "second range", in the first and the second sample groups associated with, the transmission baseband signal In(t) and the feedback signal FB(t), respectively (Step S214).

In contrast, if (FB phase-REF phase) is not within the "second range" (No at Step S213), the difference determination unit 21u allows the subtractor 21g to output "0" as the error signal e(t). If "0" is output as the error signal e(t), an update of the distortion compensation coefficient is forcedly stopped. Namely, the first and the second samples, in which the difference between the phases is not within the "second range", in the first and the second sample groups associated with the transmission baseband signal In(t) and the feedback signal FB(t), respectively, are not applied to an update of the distortion compensation coefficient. Namely, the processing steps directly proceeds to Step S205 without passing through Step S214.

Fourth Embodiment

In a fourth embodiment, at least one of upper limit threshold and the lower limit threshold in the "second range" described above is changed in accordance with the electrical power of each of the first samples in the first sample group associated with the signal before amplification in the PA 15 (i.e., the transmission baseband signal In(t). Furthermore, the basic configuration of the wireless device and the distortion compensation unit according to the fourth embodiment is the same as that of the wireless device 10 and the distortion compensation unit 12 according to the third embodiment; therefore, descriptions will be given with reference to FIGS. 1 and 9.

Configuration Example of the Wireless Device and the Distortion Compensation Unit in the wireless device 10 according to the fourth embodiment, the distortion compensation coefficient updating unit 121d changes at least one of upper limit threshold and the lower limit threshold in the "second range" described above in accordance with the electrical power of each of the first samples in the first sample group associated with the transmission baseband signal In(t). Then, the distortion compensation coefficient updating unit 121d changes at least one of the upper limit threshold and the lower limit threshold in the "second range" described above and then updates the distortion compensation coefficient.

Processing Example of the Wireless Device

Figure 12:
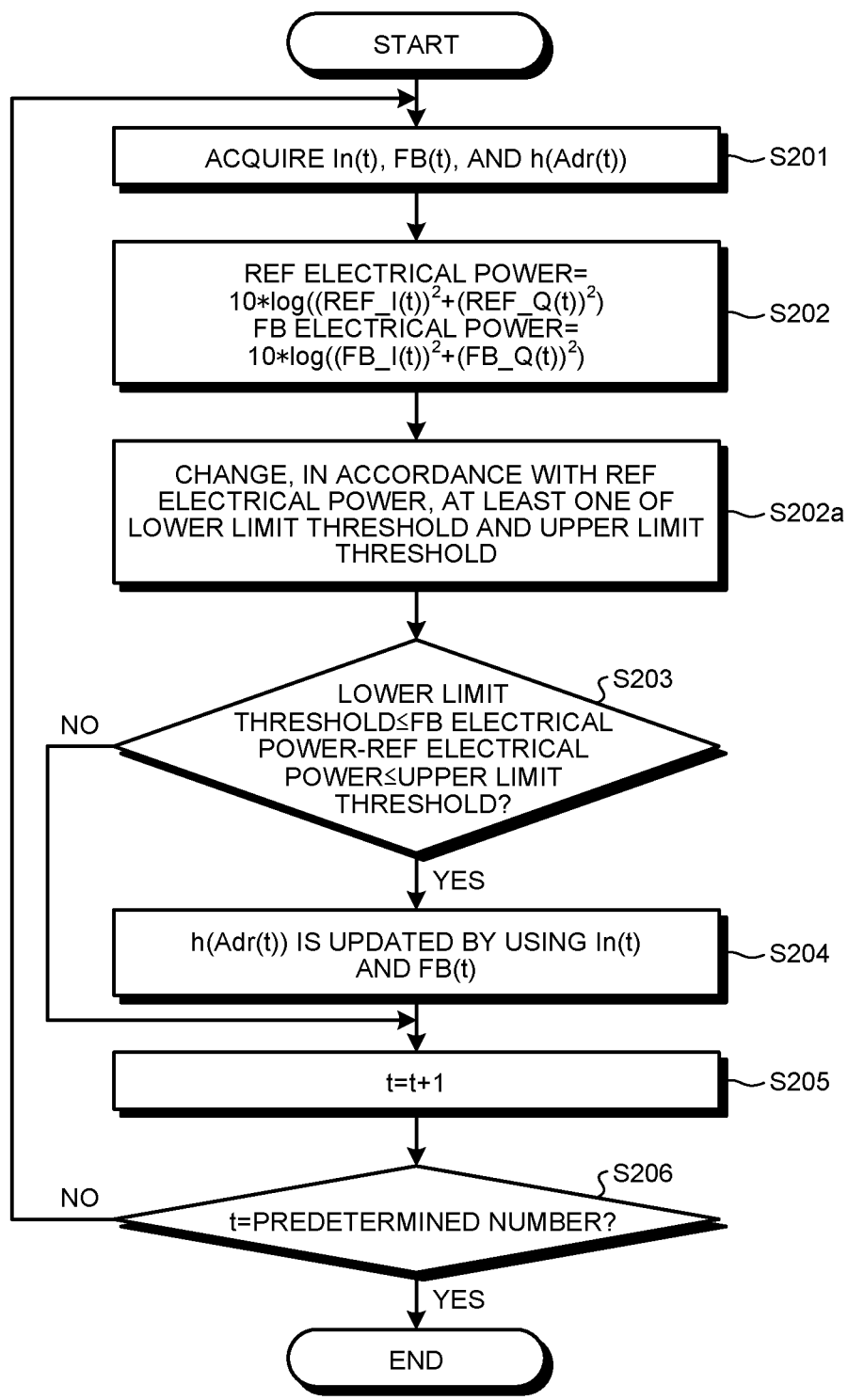
FIG. 12 is a flowchart illustrating the flow of a processing example of a wireless device according to a fourth embodiment.

FIG. 12 is a flowchart illustrating the flow of a processing example of a wireless device according to a fourth embodiment. In FIG. 12, the processes performed at Steps S201 to S206 are the same as those performed in the third embodiment; therefore, descriptions thereof will be omitted.

When the difference determination unit 21*u* in the distortion compensation coefficient updating unit 121*d* calculates the REF electrical power and the FB electrical power at Step S202, the difference determination unit 21*u* changes at least one of the lower limit threshold and the upper limit threshold in the "second range" in accordance with the REF electrical power (Step S202*a*). The difference determination unit 21*u* calculates the difference between the REF electrical power and the FB electrical power, i.e., (FB electrical power-REF electrical power). Then, the processing step proceeds to Step S203.

As described, above, in the fourth embodiment, the distortion compensation coefficient updating unit 121*d* changes the upper limit threshold or the lower limit threshold or a combination thereof in the "second range" in accordance with the electrical power of each of the first samples in the first sample group corresponding to the transmission baseband signal In(t).

With this configuration, because the time period for which the number of samples of each of the first and the second samples in which the difference between the electrical power is within the "second range" reaches the predetermined number is reduced, the time needed to converge the distortion compensation coefficient is reduced.

Fourth Modification

In the fourth embodiment described above, a description has been given of an example in which the distortion compensation coefficient updating unit 121*d* updates the distortion compensation coefficient by using the first and the second samples, in which the difference between the electrical power is within the second range, in the first and the second sample groups associated with the signal before amplification in the PA 15 and the signal after amplification in the PA 15, respectively. However, the disclosed technology is not limited to this. The distortion compensation coefficient updating unit 121*d* may also update the distortion compensation coefficient by using the first and the second samples, in which the difference between the phases is within the second range, in the first and the second sample groups associated with the signal before amplification in the PA 15 and the signal after amplification in the PA 15, respectively. Consequently, it is possible to obtain the same effect as that obtained in the fourth embodiment.

Figure 13:
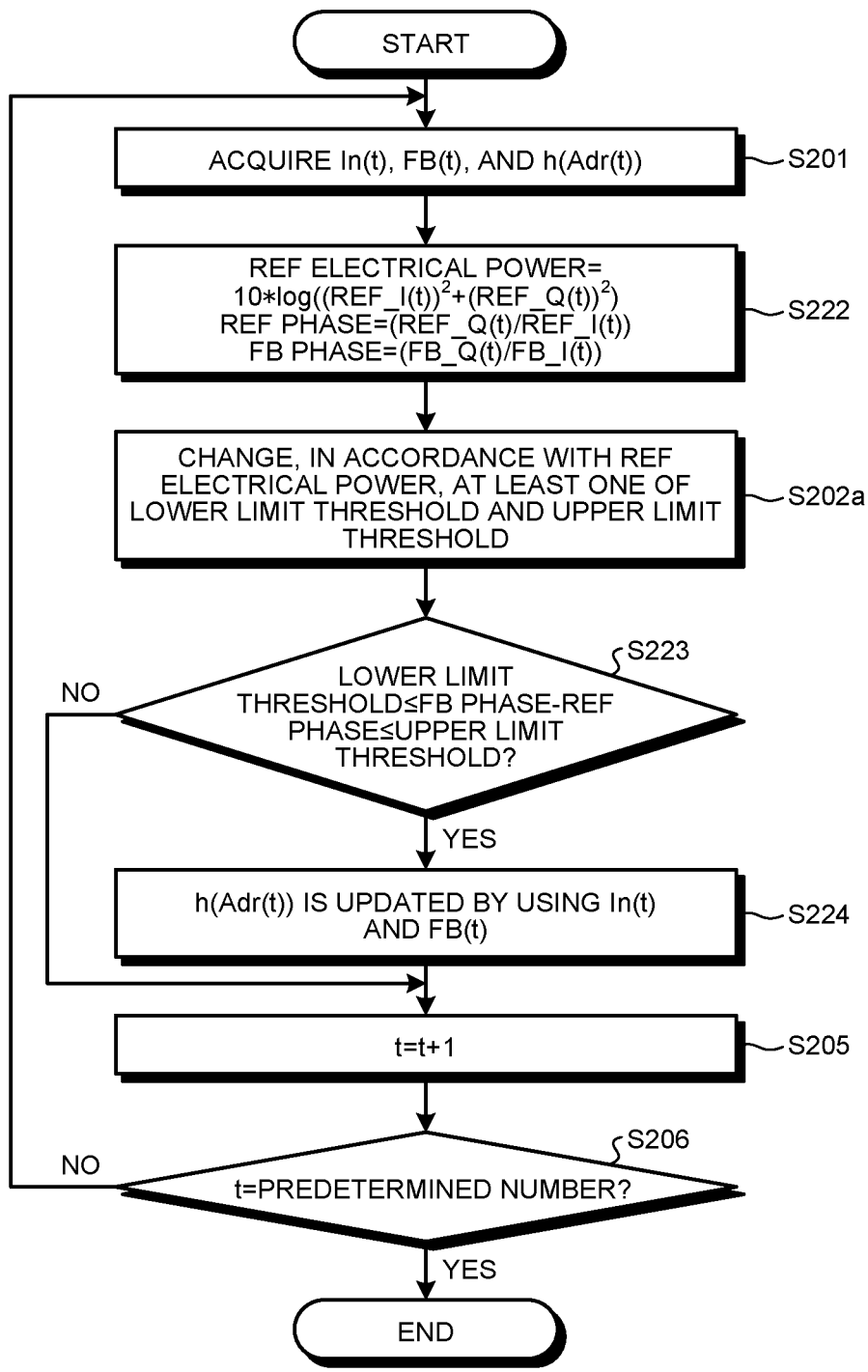
FIG. 13 is a flowchart illustrating the flow of a processing example of a wireless device according to a fourth modification.

FIG. 13 is a flowchart illustrating the flow of a processing example of a wireless device according to a fourth modification. In FIG. 13, the processes performed at Steps S201, S205, and S206 are the same as those performed in the fourth embodiment; therefore, descriptions thereof will be omitted.

If the transmission baseband signal In(t), the feedback signal FB(t), and the distortion compensation coefficient h(Adr(t)) are acquired (Step S201), the difference determination unit 21*u* in the distortion compensation coefficient updating unit 121*d* performs the following process. The difference determination unit 21*u* calculates the REF electrical power, the REF phase, and the FB phase (Step S222). The REF electrical power is the electrical power of each of the first samples in the first sample group associated with the transmission baseband signal In(t) that serves as the reference signal. The REF phase is the phase of each of the first samples in the first sample group associated with the transmission baseband signal In(t) that serves as the reference signal. The FB phase is the phase of each of the second samples in the second sample group associated with the feedback signal FB(t).

The difference determination unit 21*u* changes, in accordance with the REF electrical power, at least one of the lower limit threshold and the upper limit threshold in the "second range" (Step S202*a*). The difference determination unit 21*u* calculates the difference between the REF phase and the FB phase, i.e., (FB phase-REF phase).

The difference determination unit 21*u* determines whether (FB phase-REF phase) is within the "second range" (Step S223). The "second range" is a numerical range between the lower limit threshold and the upper limit threshold.

If (FB phase-REF phase) is within the "second range" (Yes at Step S223), the difference determination unit 21*u* allows the subtractor 21*g* to continuously output the error signal e(t). Consequently, the distortion compensation coefficient is updated by using the first and the second samples, in which the difference between the phases is within the "second range", in the first and the second sample groups associated with the transmission baseband signal In(t) and the feedback signal FB(t), respectively (Step S224).

In contrast, if (FB phase-REF phase) is not within the "second range" (No at Step S223), the difference determination unit 21*u* allows the subtractor 21*g* to output "0" as the error signal e(t). If "0" is output as the error signal e(t), an update of the distortion compensation coefficient is forcibly stopped. Namely, the first and the second samples, in which the difference between the phases is not within the "second range", in the first and the second sample groups associated with the transmission baseband signal In(t) and the feedback signal FB(t), respectively, are not applied to an update of the distortion compensation coefficient. Namely, the processing step directly proceeds to Step S205 without passing through Step S224.

Another Embodiment

Figure 14:
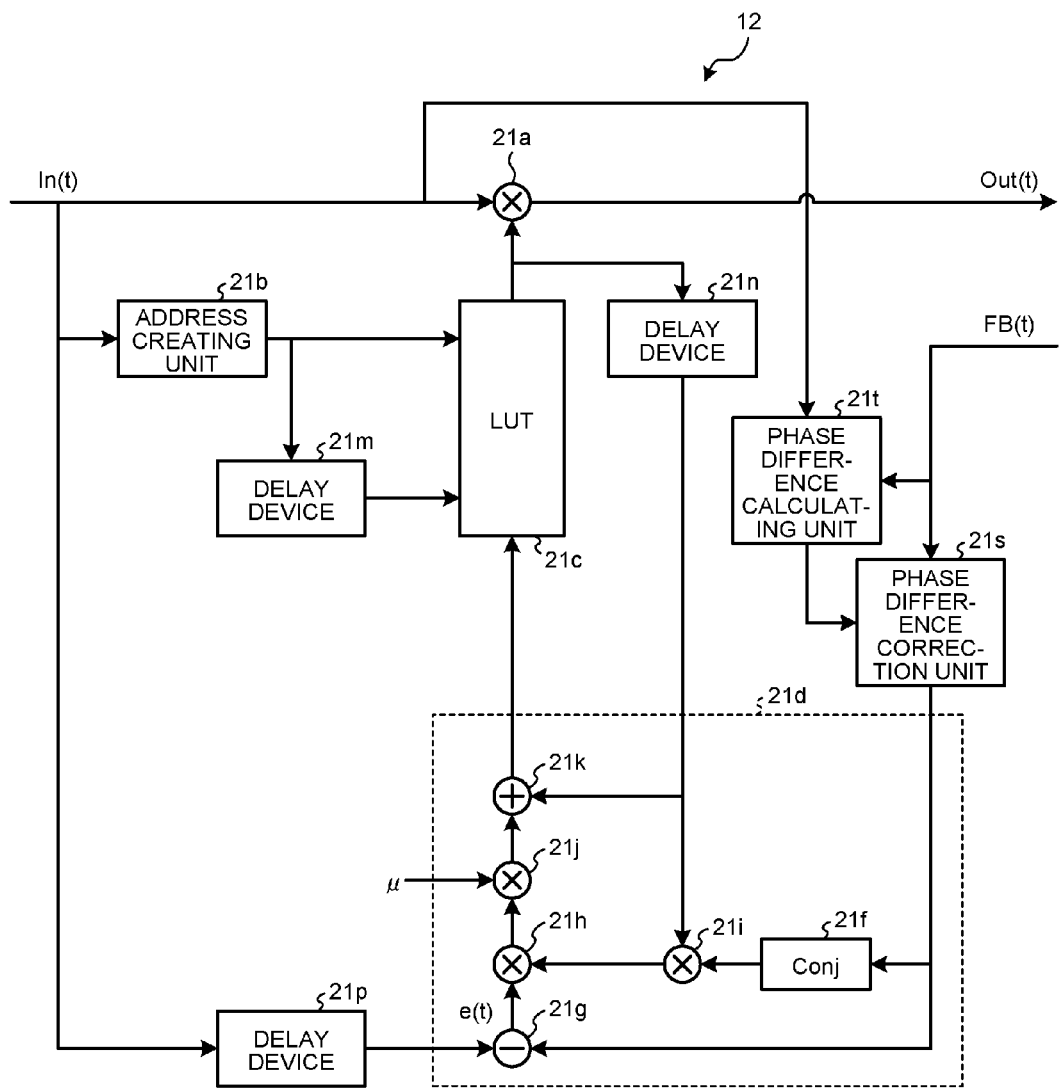
FIG. 14 is a block diagram (No. 1) illustrating a configuration example of a distortion compensation unit according to another embodiment.

In the first embodiment described above, an example in which the phase difference calculating unit 21*t* calculates, by calculating the phase difference between the PD signal Out(t) and the feedback signal FB(t), the phase difference between the transmission baseband signal In(t) that serves as the reference signal and the feedback signal FB(t) has been described. However, as illustrated in FIG. 14, the phase difference calculating unit 21*t* may also directly calculate the phase difference between the transmission baseband signal In(t) that serves as the reference signal and the feedback signal FB(t). FIG. 14 is a block diagram (No. 1) illustrating a configuration example of a distortion compensation unit according to another embodiment.

Figure 15:
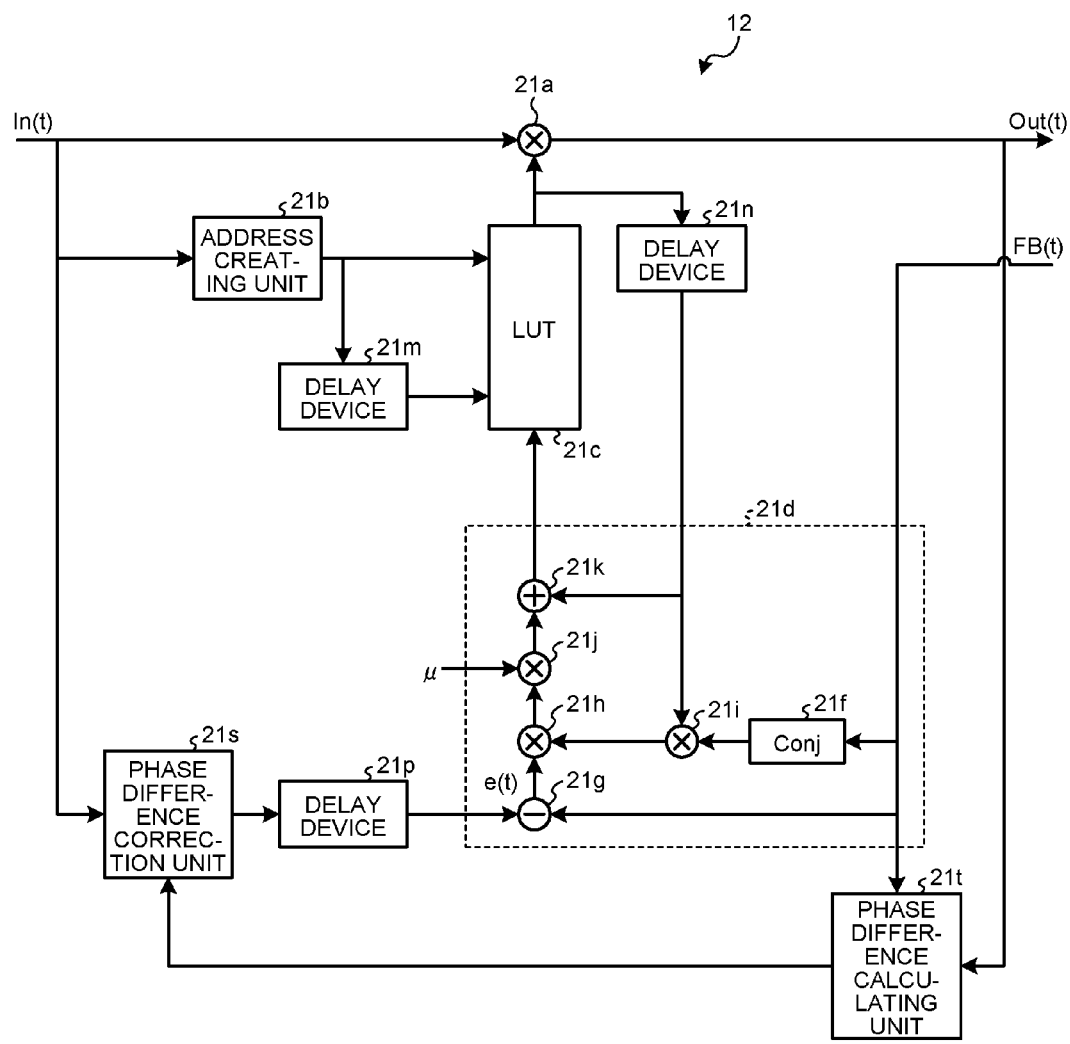
FIG. 15 is a block diagram (No. 2) illustrating a configuration example of a distortion compensation unit according to another embodiment.

In the first embodiment described above, an example in which the phase difference correction unit 21*s* corrects the phase difference by multiplying the feedback signal FB(t) by a twiddle factor that includes therein, as an angle of rotation, a value obtained by inverting the sign of the phase difference calculated by the phase difference calculating unit 21*t* has been described. However, as illustrated in FIG. 15, the phase difference correction unit 21*s* may also correct the phase difference by multiplying the transmission baseband signal In(t) by a twiddle factor that includes therein, as an angle of rotation, a value obtained by inverting the sign of the phase difference calculated by the phase difference calculating unit 21*t*. FIG. 15 is a block diagram (No. 2) illustrating configuration example of a distortion compensation unit according to another embodiment.

Figure 16:
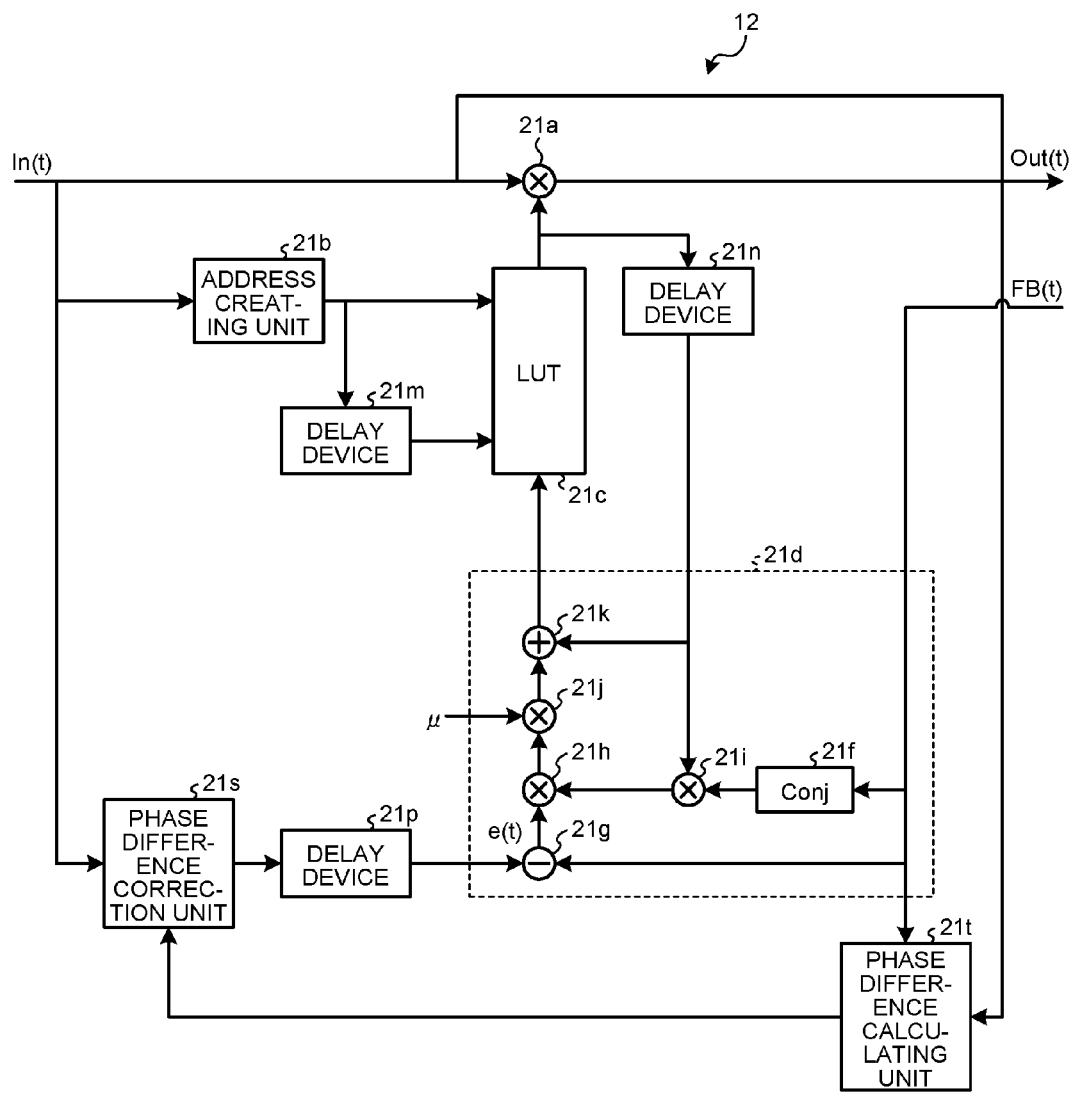
FIG. 16 is a block diagram (No. 3) illustrating a configuration example of a distortion compensation unit according to another embodiment.

In the first embodiment described above, an example in which the phase difference calculating unit 21*t* calculates, by calculating the phase difference between the PD signal Out(t) and, the feedback signal FB(t), the phase difference between the transmission baseband signal In(t) that serves as the reference signal and the feedback signal FB(t) has been described. Furthermore, in the first embodiment described above, an example in which the phase difference correction unit 21s corrects the phase difference by multiplying the feedback signal FB(t) by a twiddle factor that includes therein, as an angle of rotation, a value obtained by inverting the sign of the phase difference calculated by the phase difference calculating unit 21t has been described. However, as illustrated in FIG. 16, the phase difference calculating unit 21t may also directly calculate the phase difference between the transmission baseband signal In(t) that serves as the reference signal and the feedback signal FB(t). Furthermore, as illustrated in FIG. 16, the phase difference correction unit 21s may also correct the phase difference by multiplying the transmission baseband signal In(t) by a twiddle factor that includes therein, as an angle of rotation, a value obtained by inverting the sign of the phase difference calculated by the phase difference calculating unit 21t. FIG. 16 is a block diagram (No. 3) illustrating a configuration example of a distortion compensation unit according to another embodiment.

The wireless device according to the first embodiment to the fourth embodiment can be implemented by the following hardware configuration.

Figure 17:
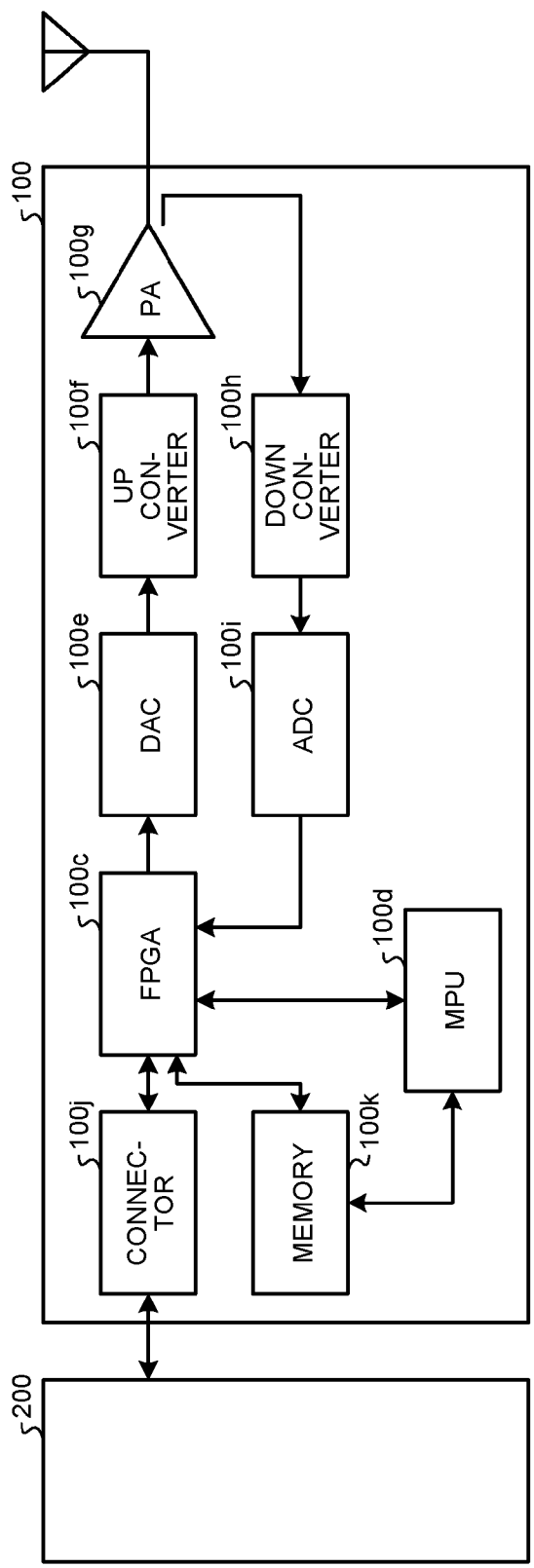
FIG. 17 is a diagram illustrating an example of the hardware configuration of the wireless device.

FIG. 17 is a diagram illustrating an example of the hardware configuration of the wireless device. As illustrated in FIG. 17, a wireless device 100 is connected to a wireless control device 200. The wireless device 100 and the wireless control device 200 are included in, for example, a single base station device. The wireless device 100 is also called radio equipment (RE) and the wireless control device 200 is also called radio equipment control (REC). The wireless device 100 includes a field programmable gate array (FPGA) 100c and a micro-processing unit (MPU) 100d. Furthermore, the wireless device 100 includes a DAC 100e, an up converter 100f, a power amplifier (PA) 100g, a down converter 100h, an ADC 100i, a connector 100j, and a memory 100k. The FPGA 100c and the MPU 100d are connected such that an input and an output of various signals or data can be performed. The memory 100k is constituted by a RAM, such as a synchronous dynamic random access memory (SDRAM), or the like, a read only memory (ROM), a flash memory. The distortion compensation unit 12 is implemented by an integrated circuit, such as the FPGA 100c, the MPU 100d, or the like.

Furthermore, the various processes described in the first embodiment to the fourth embodiment can be implemented by programs prepared in advance and executed by a computer. Namely, a program associated with each of the processes that are executed by the distortion compensation unit 12 is stored in the memory 100k and an FPGA 10c. Then, each of the programs stored in the memory 100k may also be read in the MPU 100d and may also function as a process.

According to an aspect of an embodiment of the wireless device disclosed in the present invention, an advantage is provided in that it is possible to accelerate the time at which an update of the distortion compensation coefficient is stared while correcting the phase difference between the input/output signals in an amplifier with high accuracy.

All examples and conditional language recited herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A wireless device comprising:
   an amplifier that amplifies electrical power of a signal that is wirelessly transmitted;
   a calculating unit that selects first samples and second samples, between which a difference in electrical power or phase is within a first range, in a predetermined number of first samples and the predetermined number of second samples corresponding to a first signal that is a signal before amplification in the amplifier and a second signal that is a signal after amplification in the amplifier, respectively, and that calculates a cumulative value for each of the selected first samples and the selected second samples, and that calculates a phase difference between the first signal and the second signal by using the cumulative value;
   a correction unit that corrects the phase difference by using a correction amount calculated from the phase difference; and
   an updating unit that updates, by using the first signal and the second signal of which the phase difference is corrected, a distortion compensation coefficient that is used to compensate nonlinear distortion generated in the amplifier.

2. The wireless device according to claim 1, wherein the calculating unit changes, in accordance with electrical power of each of the predetermined number of first samples, an upper limit threshold or a lower limit threshold or a combination thereof in the first range.

3. The wireless device according to claim 1, wherein the updating unit selects first samples and second samples, between which a difference in electrical power or phase is within a second range, in the predetermined number of first samples and the predetermined number of second samples corresponding to the first signal and the second signal, respectively, of which the phase difference is corrected and that updates the distortion compensation coefficient by using the selected first samples and the selected second samples.

4. The wireless device according to claim 3, wherein the updating unit changes, in accordance with the electrical power of each of the predetermined number of first samples, an upper limit threshold or a lower limit threshold or a combination thereof in the second range.

* * * * *